United States Patent [19]
Miyaake et al.

[11] Patent Number: 5,814,393
[45] Date of Patent: Sep. 29, 1998

[54] FLEXIBLE PRINTED CIRCUIT

[75] Inventors: Chiharu Miyaake; Toshihiko Sugimoto; Yousuke Miki, all of Osaka, Japan

[73] Assignee: Nitto Denko Corporation, Osaka, Japan

[21] Appl. No.: 734,454

[22] Filed: Oct. 18, 1996

[30]     Foreign Application Priority Data

Oct. 19, 1995 [JP] Japan .................................. 7-271535
Jan. 11, 1996 [JP] Japan .................................. 8-003358

[51] Int. Cl.⁶ .................................. B32B 3/00; H05K 1/00
[52] U.S. Cl. ........................ 428/209; 428/901; 361/749; 361/750
[58] Field of Search .................................. 428/209, 901; 361/749, 750

[56]              References Cited

U.S. PATENT DOCUMENTS

| | | | |
|---|---|---|---|
| 3,346,415 | 10/1967 | Hachenberger | 428/210 |
| 4,311,749 | 1/1982 | Hiraiwa et al. | 428/209 |
| 4,975,312 | 12/1990 | Lusignea et al. | 428/209 |
| 5,077,122 | 12/1991 | Yen et al. | 428/901 |
| 5,324,574 | 6/1994 | Sakamoto et al. | 428/327 |
| 5,374,469 | 12/1994 | Hino et al. | 428/209 |
| 5,401,558 | 3/1995 | Sakamoto et al. | 428/327 |

FOREIGN PATENT DOCUMENTS 5-116242  5/1993  Japan .
6-143435  5/1994  Japan .

*Primary Examiner*—Cathy F. Lam
*Attorney, Agent, or Firm*—Sughrue, Mion, Zinn, Macpeak & Seas, PLLC

[57]           ABSTRACT

A raw material plastic film like a band stretched in two directions with a machine direction as a longitudinal direction of stretch and a transverse direction as a lateral direction of stretch is prepared. One standard line parallel with the machine direction of stretch is assumed on a film face of the raw material plastic film. An area due to cut a cover layer plastic film and an area due to cut a base layer plastic film (the two areas are of almost the same shape) are assumed to be on the standard line in a state in which the areas are aligned in orientation. However, both an arbitrary point of the area due to cut and the point of the area due to cut corresponding thereto need to be on the standard line. A cover layer plastic film and a base layer plastic film are cut out from the two areas due to cut. Metal electric circuit is formed on a surface of the base layer plastic film via an adhesive layer. The metal electric circuit has a plastic deformation component of 0.0003 (mm/mm) or more when a stress load is imposed until strain becomes 0.002 (mm/mm), and then removed. The cover layer plastic film is stuck on the metal electric circuit via an adhesive layer with the rear face of the plastic film facing the surface of the base layer plastic film, thereby manufacturing a flexible printed circuit.

20 Claims, 20 Drawing Sheets

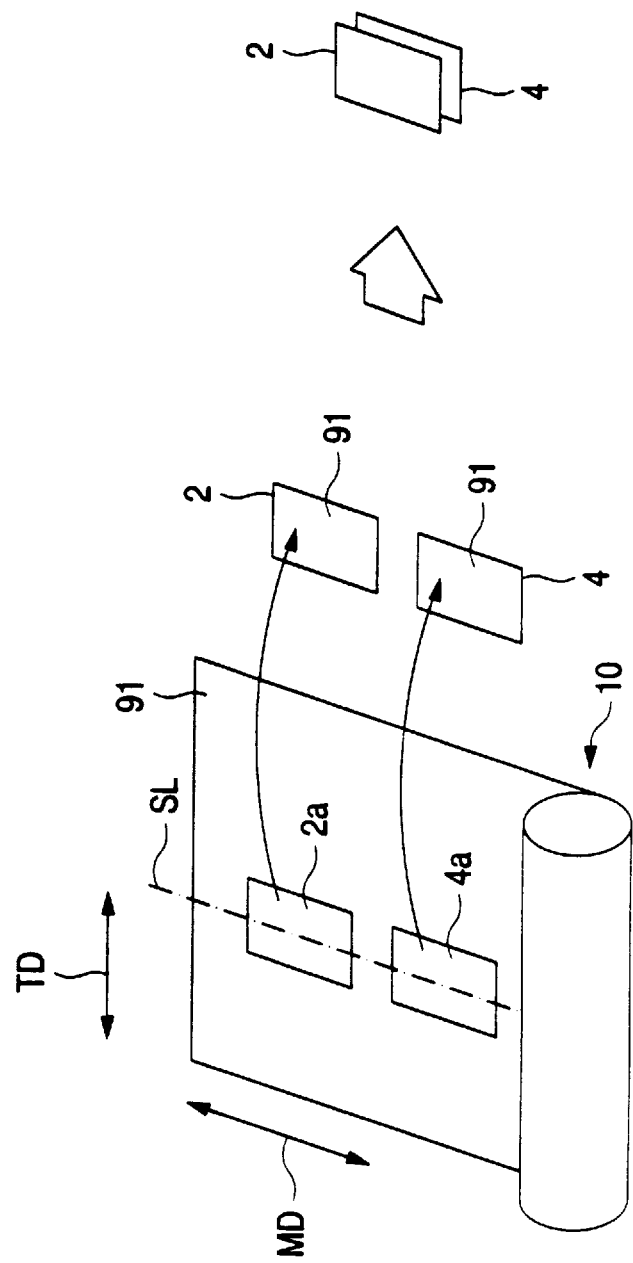

|r|: ABSOLUTE VALUE OF LINEAR EXPANSION COEFFICIENT
θ : MEASUREMENT ANGLE

○ MEASUREMENT DATA
◆▬▶ CRYSTAL ORIENTATION SUB AXIS
◀▬▶ CRYSTAL ORIENTATION MAIN AXIS

FIG. 18
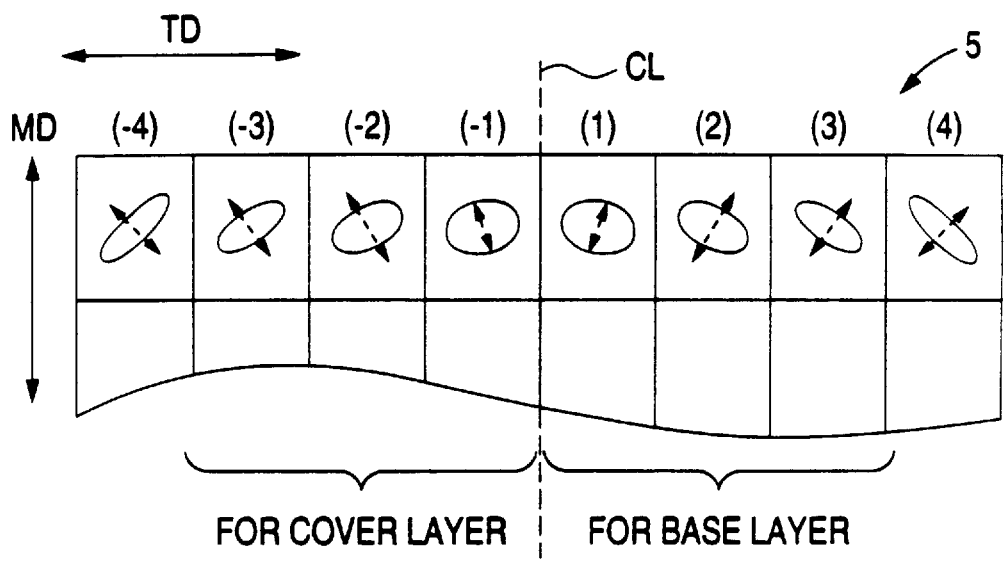
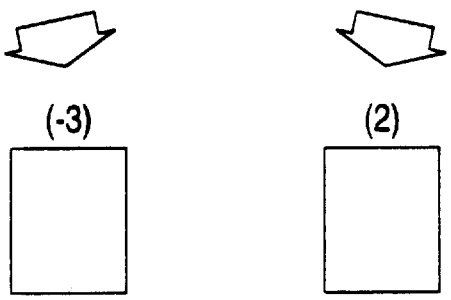
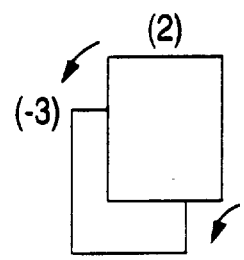

FLEXIBLE PRINTED CIRCUIT

BACKGROUND OF THE INVENTION

This invention relates to a flexible printed circuit of a functional part used mainly in electric and electronic fields.

Hitherto, printed circuits rich in flexibility have been commonly called flexible printed circuits and generally used in fields of electronics, etc. FIGS. 14A to 14D show an embodiment of the flexible printed circuit. A flexible printed circuit comprises a predetermined metal electric circuit 3 formed on a plastic film 4 (for a base layer) and a plastic film 2 (for a cover layer) similar to the plastic film 4 furthermore formed on the metal electric circuit 3. Generally, to form the plastic films, a material film is stretched in two directions of machine and transverse directions and the plastic films are cut out to a predetermined size from the stretched film. The machine and transverse directions mean longitudinal and lateral directions of the material film.

After electronic parts such as semiconductor devices are mounted on a flexible printed circuit, the flexible printed circuit in installed in an electronic machine, etc., it may be bent depending on the electronic machine, etc., with which the flexible printed circuit is used. For example, a flexible printed circuit used to wire a print head (operating part) and a mother board (fixed part) in a printer is bent as the printer operates. Thus, flexible printed circuits used at such operating places require sufficient flexibility and durability.

An analysis on the physical property of metal electric circuit is carried out for the requirements, because, of main components of flexible printed circuits, plastic films originally have flexibility and metal electric circuits of other main components cause a problem. Specifically, deformations of metal electric circuit include a plastic deformation and an elastic deformation, and the nature of the plastic deformation is improved to provide flexibility.

However, a flexible printed circuit formed with a metal electric circuit improved in the plastic deformation nature involves a problem of occurrence of warpage called a curl. As described above, the flexible printed circuit has plastic films as main components other than the metal electric circuit; the plastic films have flexibility, but little plastic deformation nature as compared with the metal electric circuit. That is, in the flexible printed circuit improved in flexibility, the plastic films easily become elastically deformed, while the metal electric circuit easily becomes plastically deformed. Bonding of two types of members having such natures contrary to each other results in occurrence of a curl in the flexible printed circuit. This point will be discussed along the flexible printed circuit manufacturing process. For example, as shown in FIGS. 17A and 17B, an adhesive layer 8 is formed on a base layer plastic film 4 and copper foil 3a is placed on the adhesive layer 8. Tension is applied in the film face direction as indicated by arrows in two steps of heating and pressurizing such as laminate treatment as shown in FIG. 17C and cooling to the room temperature after heating and pressurizing, then etching the copper foil 3a by a subtractive method, etc., to form metal electric circuit as shown in FIG. 17D. When the tension is removed, the plastic film 4 is restored to the former length (elastic deformation), but the metal electric circuit 3 holds the extension state (plastic deformation). As a result, as shown in FIG. 17E, the flexible printed circuit warps as if it were a bimetal, causing a curl to occur. Normally, after formation of the metal electric circuit 3, a plastic film is stuck on the metal electric circuit to form a cover layer; even if such a step is taken, the curl remains.

Such a flexible printed circuit with a curl occurring involves a problem in shape accuracy and when semiconductor devices are mounted on the flexible printed circuit or the flexible printed circuit is installed in an electronic machine, a harmful influence happens.

SUMMARY OF THE INVENTION

It is therefore an object of the invention to provide a flexible printed circuit having sufficient flexibility and durability with curl occurrence suppressed.

According to a first aspect of the invention, there is provided a composite sheet comprising: a first resin film; a second resin film laminated on the first resin film so that a surface of the first resin film faces a rear face of the second resin film; and a metal electric circuit formed between the first and second resin films, the metal electric circuit having a plastic deformation component of 0.0003 (mm/mm) or more when a stress load is imposed until strain becomes 0.002 (mm/mm) assuming that the plastic strain occurring when the stress load is imposed and removed is the plastic deformation component; wherein the first and second resin films are cut out from two areas due to cut, having substantially the same shape each other, the two areas are aligned mutually in orientation, an arbitrary point of one of the two areas due to cut and a point of the other corresponding to that point are both on an arbitrary standard line parallel with a machine direction of stretch on a material plastic film stretched in two directions with a machine direction as a longitudinal direction of stretch and a transverse direction as a lateral direction of stretch.

According to a second aspect of the invention, a composite sheet comprising: a first resin film; a second resin film laminated on the first resin film so that a surface of the first resin film faces a rear face of the second resin film; and a metal electric circuit formed between the first and second resin films, the metal electric circuit having a plastic deformation component of 0.0003 (mm/mm) or more when a stress load is imposed until strain becomes 0.002 (mm/mm) assuming that the plastic strain occurring when the stress load in imposed and removed is the plastic deformation component; wherein two ellipses of coefficient of linear expansion are created on coordinates in corresponding parts of the first and second resin films by the following methods: comprising the steps of: defining a predetermined base point P on the resin film; measuring a coefficient of linear expansion at a position separate from an arbitrary axis in angle $\theta$ direction on the first and second resin films, the arbitrary axis being selected on the first and second resin films so as to pass through the base point P with the base point P as a center and direct an arbitrary direction; preparing a coordinate system with the arbitrary axis as a Y axis and an axis crossing the Y axis at 90 degrees as an X axis, in this coordinate system; defining an intersection of the X and Y axes as the base point P in the linear expansion coefficient measurement and magnitude of a linear expansion coefficient measurement value as distance r from the base point P, then plotting a tip point of the distance r in the measurement angle $\theta$ direction with respect to the Y axis, plotting it multiple times by changing the measurement angle $\theta$, and drawing an analysis line throughout 360-degree directions with the base point P as the center so as to pass through average points of the plotted points for creating the ellipse: and the two ellipse are overlapped so as to match in the center point and coordinate axes X and Y, and the following relationship is satisfied: the maximum value of a linear expansion coefficient difference between the two resin films is equal to or less than a predetermined value.

According to a third aspect of the invention, there is provided a composite sheet comprising: a first resin film; and a second resin film laminated on the first resin film so that a surface of the first resin film faces a rear face of the second resin film; and a metal electric circuit formed between the first and second resin films, the metal electric circuit having a plastic deformation component of 0.0003 (mm/mm) or more when a stress load is imposed until strain becomes 0.002 (mm/mm) assuming that the plastic strain occurring when the stress load is imposed and removed is the plastic deformation component; wherein two ellipses of coefficient of linear expansion are created on coordinates in corresponding parts of the first and second resin films by the following method: comprising the steps of: defining a predetermined base point P on the resin film; measuring a coefficient of linear expansion at a position separate from an arbitrary axis in angle $\theta$ direction on the first and second resin films, the arbitrary axis being selected on the first and second resin films so as to pass through the base point P with the base point P as a center and direct an arbitrary direction; preparing a coordinate system with the arbitrary axis as a Y axis and an axis crossing the Y axis at 90 degrees as an X axis, in this coordinate system; defining an intersection of the X and Y axes as the base point P in the linear expansion coefficient measurement and magnitude of a linear expansion coefficient measurement value as distance r from the base point P, then plotting a tip point of the distance r in the measurement angle $\theta$ direction with respect to the Y axis, plotting it multiple times by changing the measurement angle $\theta$, and drawing an analysis line throughout 360-degree directions with the base point P as the center so as to pass through average points of the plotted points for creating the ellipses: and the two ellipse are overlapped so as to match in the center point and coordinate axes X and Y, and the following relationship is satisfied: the total area of portions where the ellipses do not overlap is equal to or less than a predetermined value.

In the second and third aspects of the invention, an arbitrary axis is selected arbitrarily on the two plastic films, and a coordinate system with the arbitrary axis as a Y axis and an axis crossing the Y axis at 90 degrees as an X axis is prepared. However, it is allowed to settle an axis of the machine direction of plastic film stretch as the Y axis and an axis of the transverse direction of plastic film stretch as an X axis.

Here, the plastic deformation component will be discussed.

When tension (stress $\sigma$) is applied to a material such as metal foil, a deformation amount occurs in response to the tension. To normalize the material size, the deformation amount is represented by strain $\epsilon$. This strain $\epsilon$ is the ratio of the increased amount of the material length when the material is deformed (length under stress load) to the original length and definition expression (1) of the strain $\epsilon$ is as follows:

$$\epsilon(mm/mm)=(\Delta l/l_0)=(l_1-l_0)/l_0 \qquad (1)$$

where $l_0$: Length before stress load $l_1$: Length under stress load

A graph representing the relationship between the stress $\sigma$ and the strain $\epsilon$ is called an S-S (stress-strain) curve chart. Embodiments of S-S curves of metal foil are shown in graphs of FIGS. 7 to 10. These S-S curves are provided by gradually imposing a stress to metal foil and after the stress reaches a given value, gradually decreasing (removing) the stress. Therefore, two S-S curves appear in one graph; in the figures, the direction of the S-S curve provided by gradually imposing the stress (go way) is indicated by the solid line arrow and the direction of the S-S curve provided by gradually decreasing (removing) the stress (return way) is indicated by the dotted line arrow.

First, the graph of FIG. 7 shows an S-S curve drawn when a load of extremely small stress $\sigma$ as strain $\epsilon$ is less than 0.0005 is imposed and removed. As shown here, when such a small stress load is imposed, the S-S curve becomes a straight line; the line of the stress load (solid line arrow direction) and that of the stress removal (dotted line arrow direction) substantially overlap and when the stress becomes 0, the strain also becomes 0. In this case, only an elastic deformation is observed in the metal foil. The line inclination is responsive to the tensile modulus of the metal foil.

The graphs of FIGS. 8 to 10 are S-S curve charts drawn when the maximum stress load imposed is increased in the order. As shown here, as the stress load imposed increases, the go and return ways of the S-S curves largely differ. That is, when stress load is imposed (go way), a line is drawn in a small-stress region, but a line is lost and a curve close to an asymptote is drawn in a high-stress region. When the stress is removed (return way), a line having the same inclination as the go-way line is drawn. This inclination is responsive to the tensile modulus of the metal foil, as described above. As shown in the graphs of FIGS. 8 to 10, if the stress load imposed is completely removed (stress 0), the metal foil is not restored to the original length and strain remains. Such strain left if the stress is removed is called plastic strain. This plastic strain increases as the maximum stress load imposed increases. That is, the plastic strain increases in the order of FIGS. 8 to 10. It represents the plastic deformation nature of the material and in the invention, the plastic strain is referred to as "plastic deformation component."

In the invention, the coefficient of linear expansion $\alpha$ is derived as follows: When a plastic film is heated, it expands in response to the characteristics of the plastic film. At this time, the coefficient of linear expansion $\alpha$ can be found according to the following expression (2) from the change ratio of the length of the plastic film, p, to temperature t at the measurement time ($\partial p/\partial t$) and the length of the film, p0, at 0° C. (Kagaku Binran-Kisohen II, edited by Nippon Kagakukai, published by Maruzen Shuppan).

$$\alpha=1/P_0\times\partial p/\partial t \qquad (2)$$

However, the coefficient of linear expansion $\alpha$ mentioned in the invention refers to that in region of glass transfer temperature of plastic film (Tg) or less. Since Tg of the plastic films to which the invention is applied is in the temperature range exceeding the room temperature (about 23° C.) and a twisted curl becomes a problem in a temperature region near the room temperature, the coefficient of linear expansion at Tg or softening point or less becomes the target. Tg of polyimide films is 300° C. or more, which exceeds the operating temperature range, and does not appear clearly, thus the necessity for considering Tg of polyimide films is small.

In the invention, the total area of portions where ellipses do not overlap (C) is defined by the following expression (3) representing the integral value of linear expansion coefficient square value differences ($\Delta\alpha c$). That is, in the invention, the total area of portions where ellipses do not overlap (C) is synonymous with the integral value of linear expansion coefficient square value differences ($\Delta\alpha c$). In the following expression (3), $\theta$ is a linear expansion coefficient measurement angle with the axis of the machine direction of stretch as the reference and $\Delta\alpha c$ ($\theta$) is defined by the following expression (4). The ellipses in the invention contain perfect circles.

$$C = 1/2 \int_0^{2x} \Delta\alpha_0(\theta) d\theta \qquad (3)$$

$$\Delta\alpha_0(\theta) = |r_1^2(\theta) - r_2^2(\theta)| \qquad (4)$$

In the invention, the expression "both the outermost layers" of "two plastic films positioned on both the outermost layers, of laminated plastic films" does not mean both the outermost layers of the flexible printed circuit and is used to mean both the outermost layers in the plastic film laminate. Therefore, for example, if a flexible printed circuit comprises a shielding layer formed on a plastic film laminate by painting, printing, etc., the shielding layer is not contained in "both the outermost layers" in the invention.

Hereupon, in the second and third aspects of the invention, the directions of the coordinate axes of the ellipses may be selected arbitrarily on the plastic film. In other words, the Y axis and the X axis are settled in the arbitrary directions to prepare the coordinate system, the ellipses are created on such coordinates. The two plastic films positioned on both the outermost layers may be selected by using the above ellipse and conditions.

In the invention, the expression "curl suppression" refers to the case where the curl degree (%) defined below becomes 5% or less. Assume that the length of the long side of the smallest rectangle in which a flexible printed circuit is inscribed is the longest length of the flexible printed circuit, L. FIG. 12A shows an embodiment of smallest rectangle 21 in which a flexible printed circuit 1a like a substantial V-shape is inscribed. As shown here, in the flexible printed circuit 1a, the length of the long side of the rectangle 21 indicated by the dotted line becomes the longest length L. As shown in FIG. 12B, one end of the flexible printed circuit 1a is fixed to a reference plane 6 and the height of the maximum warpage of the flexible printed circuit 1a from the reference plane 6, h, is found and is defined as curl amount h. The percentage of the curl amount h to the longest length of the flexible printed circuit, L, namely, (h/L)×100 is defined as the curl degree (%).

Hereupon, the surface and rear face of the plastic film are decided suitably corresponding to the each cases. Normally, the surface and rear face of the plastic film differ plainly in surface (rear face) state of wet property, coarseness, etc, so that the surface and rear face are distinguished completely each other. Therefore, for example, when a plastic film is cut out from the material plastic film, a first face of the plastic film which is the same with the surface of the material plastic film can be a surface of the plastic film, and a second face of the plastic film which is the same with the rear face of the material plastic film can be a rear face of the plastic film. Further, when two different kinds of plastic films are each cut out from the different kinds of the plastic films, the similar faces with each other may serve as a surface or rear face.

Next, the technical philosophy of the invention will be discussed.

FIG. 1 shows an embodiment of the present invention.

As shown here, a raw material plastic film 10 like a band stretched in two directions with the machine direction as a longitudinal direction of stretch and the transverse direction as a lateral direction of stretch is prepared. In the figure, MD denotes the machine direction of stretch and TD denotes the transverse direction of stretch. In the raw material plastic film 10, one arbitrary standard line SL parallel with the machine direction of stretch (MD) is assumed and two areas due to cut 2a and 4a of almost the same shape (in the figure, rectangles) are assumed to be on the standard line. However, the two areas due to cut 2a and 4a are aligned mutually in orientation and an arbitrary point of the area due to cut 2a and the point of the area due to cut 4a corresponding thereto are on the standard line SL. In the figure, the center points of the areas due to cut 2a and 4a are taken as the arbitrary point of the area due to cut 2a and the point of the area due to cut 4a corresponding thereto. Two plastic films 2 and 4 are cut out from the areas due to cut 2a and 4a. These two plastic films 2 and 4 have surfaces 91 in the same state as a surface 91 of the raw material plastic film 10. They are placed on both the outermost layers of the plastic film laminate with the surface of one plastic film facing the rear face of the other. Specifically, as shown in FIG. 2A, both plastic films 2 and 4 are placed with the surface 91 of the plastic film 4 facing a rear face 92 of the plastic film 2. FIG. 2B is a sectional view of FIG. 2A and parts identical with those previously described with reference to FIG. 2A are denoted by the same reference numerals in FIG. 2B. In FIGS. 1, 2A and 2B, the metal electric circuit is not shown.

If how to cut out two plastic films placed on both the outermost layers of a plastic film laminate from a raw material plastic film is specified and how to place these two plastic films is specified, the two plastic films can be matched substantially in physical properties of thermal shrinkage factor, coefficient of linear expansion, tensile modulus, etc. Resultantly, the deformation amounts of both the outermost layers of the plastic film laminate forming a flexible printed circuit can be balanced and if the metal electric circuit and the plastic films differ in deformation nature, a curl is suppressed. Moreover, since the flexibility and durability of the metal electric circuit and the plastic films do not change, those of the flexible printed circuit become sufficient.

In the conventional flexible printed circuit, it was recognized that plastic films cut out from a bidirectionally stretched raw material plastic film are the same in physical properties of coefficient of linear expansion, etc. However, the inventor et al. carried out a detailed analysis on the physical properties of raw material plastic films and found out that the former recognition is wrong. That is, according to study of the inventor et al., the raw material plastic film varies in physical properties of coefficient of linear expansion, etc., from one part of the plastic film to another. The possible reason is that stress imposed when the raw material plastic film in stretched varies depending on the part of the raw material plastic film. The inventor et al. furthermore examined the physical properties and found the fact that the physical properties largely change in the transverse direction of the raw material plastic film like a band, but little change in the machine direction of the raw material plastic film. Based on this knowledge, the inventor et al. have developed the cutting method and the placement method as described above.

Further, the metal electric circuit is specified so as to have a plastic deformation component of 0.0003 (mm/mm) or more in the present invention. This numeric value is a significant value found by the inventor et al. from the relationship with two plastic films used as both the outermost layers of a plastic film laminate in addition to the flexibility and durability of a flexible printed circuit.

Next, another technical philosophy of the invention will be discussed.

To solve the problem of curl occurrence of flexible printed circuits, the inventor et al. first carried out a detailed analysis of the cause of curl occurrence of flexible printed circuits. As a result, the inventor et al. have found that curl occurrence is caused by the linear expansion coefficient difference between plastic films. If different materials are laminated, it can be easily imagined that warpage (curl) occurs because they differ in coefficient of linear expansion. Normally, flexible printed circuits use plastic films (for example, base and cover layer films) made of the same material and therefore formerly it was considered that the plastic films made of the same material do not differ in coefficient of linear expansion. However, the inventor et al. actually measured coefficients of linear expansion in detail and found that the plastic films of each flexible printed circuit differ in coefficient of linear expansion. Nobodies in the flexible printed circuit field found this knowledge until the inventor et al. found it.

The inventor et al. continued to examine the linear expansion coefficient difference and found that each bidirectionally stretched plastic film used with a flexible printed circuit shows anisotropy in its coefficient of linear expansion. That is, a predetermined base point P is defined on the film surface of the plastic film and the coefficient of linear expansion in angle θ direction with respect to the axis of the machine direction of plastic film stretch passing through the base point P with the base point P as the center is measured. On the other hand, a coordinate system with the axis of the machine direction of plastic film stretch as a Y axis and the axis of the transverse direction of plastic film stretch as an X axis is prepared. In this coordinate system, the intersection of the X and Y axes is defined as the base point P in the linear expansion coefficient measurement and the magnitude of the linear expansion coefficient measurement value is defined as distance r from the base point P, then the tip point of this distance r is plotted in the measurement angle θ direction with respect to the Y axis. It is plotted multiple times by changing the measurement angle θ and an analysis line is drawn throughout 360-degree directions with the base point P as the center so as to pass through average points of the plotted points. Then, an ellipse as shown in FIG. 3 is provided. In the figure, MD denotes the axis of the machine direction of stretch (Y axis) and TD denotes the axis of the transverse direction of stretch (X axis). Solid line arrow A indicates the crystal orientation main axis of the plastic film and dotted line arrow B indicates the crystal orientation subaxis of the plastic film. Also, θ is a linear expansion coefficient measurement angle with respect to MD. r represents the linear expansion coefficient magnitude as a distance from the base point P and has a tip plotted with 0. Such plotting is called polar coordinate plotting. As seen from the ellipse provided by the polar coordinate plotting (see FIG. 3), normally the crystal orientation main axis of the plastic film (arrow A) becomes a direction inclined from the machine direction of stretch (MD) and the coefficients of linear expansion also vary depending on the direction (anisotropy) because of anisotropy of the crystal orientation. Resultantly, it is considered that the analysis line of the coefficients of linear expansion of the bidirectionally stretched plastic film shows an ellipse.

Next, as shown in FIG. 4, when ellipses on coordinates provided for two stretched plastic films made of the same material are overlapped so that they match in center point and coordinate axes, it is seen that the two plastic films differ in crystal orientation direction and coefficient of linear expansion in parts (directions). Normally, a raw material film is stretched in two directions, from which plastic films used with a flexible printed circuit are cut out to a predetermined size. Therefore, the reason why the plastic films made of the same material differ in coefficient of linear expansion may be that the stress imposed when the plastic film is stretched in two directions varies from one part of the plastic film to another.

The inventor et al. examined a method for controlling the linear expansion characteristic difference between the plastic films provided when ellipses created by polar coordinate plotting are overlapped and suppressing curl occurrence of flexible printed circuits. In the process, the inventor et al. hit on an idea of using indexes of the maximum value of the linear expansion coefficient difference ($\Delta\alpha$) and the total area of portions where ellipses do not overlap (C) and repeated various experiments based on the idea. Resultantly, the inventor et al. have found that if the maximum value of the linear expansion characteristic difference ($\Delta\alpha$) provided when ellipses created for two plastic films positioned on both the outermost layers, of two or more laminated plastic films making up a flexible printed circuit are overlapped is equal to or less than $1.4 \times 10^{-5}$ (1/°C.), curl occurrence of the flexible printed circuit is suppressed. Likewise, the inventor et al. have found that if the total area of the portions where the ellipses do not overlap when they are overlapped (C) is set equal to or less than $6.5 \times 10^{-10}[(1/°C.) \times (1/°C.)]$, curl occurrence of the flexible printed circuit is also suppressed.

The point to be noted is that only the two plastic films positioned on both the outermost layers, of laminated plastic films making up the flexible printed circuit need to satisfy at least one of the two conditions. Therefore, a plastic film positioned on an intermediate layer need not be considered.

Next, embodiments of the experiment results from which the predetermined values were derived are shown in graphs of FIGS. 5 and 6. In the experiments, the curl amounts were measured by the above-described method and the coefficients of linear expansion were measured by TMA (thermal mechanical analysis). The maximum value of the linear expansion coefficient difference ($\Delta\alpha$) and the total area of portions where ellipses do not overlap (C) were derived by a method described later.

The graph of FIG. 5 represents the relationship between the ratio between the curl amount and length [curl degree (%)] and the maximum value of the linear expansion coefficient difference ($\Delta\alpha$). As shown here, it is seen that both indicate a linear relationship and that the maximum value of the linear expansion coefficient difference ($\Delta\alpha$) at which curl occurrence is reliably suppressed (the curl degree is 5% or less) is $1.4 \times 10^{-5}$ (1/°C.).

On the other hand, the graph of FIG. 6 represents the relationship between the ratio between the curl amount and length [curl degree (%)] and the total area of portions where ellipses do not overlap (C). As shown here, it is seen that both indicate a relationship like a quadratic curve and that the total area of portions where ellipses do not overlap (C) at which curl occurrence is reliably suppressed (the curl degree is 5% or less) is $6.5 \times 10^{-10}[(1/°C.) \times (1/°C.)]$.

The two indexes of the maximum value of the linear expansion coefficient difference ($\Delta\alpha$) and the total area of portions where ellipses do not overlap (C) can and should be used at the same time.

Further, in the first aspect of the invention, it is possible to prevent the curl occurrence more effectively by adopting at least one of the maximum value of the linear expansion coefficient difference ($\Delta\alpha$) and the total area of portions where ellipses do not overlap (C) with respect to the outermost two plastic films.

Furthermore, in the second and third aspect of the inventions, two outermost plastic films are disposed in such a manner that the surface of one plastic film and the rear face of another plastic film are opposed each other. In this case, it becomes possible to cut out plastic films for cover and base layers from one material plastic film in such a manner that they direct the same direction. Therefore, it becomes easy to cut out the plastic films in the manufacturing steps of the flexible printed circuit. On the other hand, if the surfaces of both one and another plastic film are opposed each other, the plastic films have to be cut out from the symmetrical positions in the transverse direction, so it is complicated to cut out the plastic films. Further, when the surface of one plastic film and the rear face of another plastic film are opposed each other, the surface and rear face of the plastic film differ plainly in surface (rear face) state of wet property, coarseness, etc, so that the surface and rear face of the flexible printed circuit are distinguished completely each as other. Therefore, for example, it can be expected to improve the treatment of the flexible printed circuit in the wiring process or the like.

BRIEF DESCRIPTION OF THE DRAWINGS

In the accompanying drawings:

FIG. 1 is an illustration to show one Embodiment of the invention;

FIG. 18 is an illustration to show a state of cutting out plastic films from a raw material film in Embodiment of the invention;

DETAILED DESCRIPTION OF THE PREFERRED EMBODIMENTS

Next, the invention will be discussed specifically.

Figure 16:
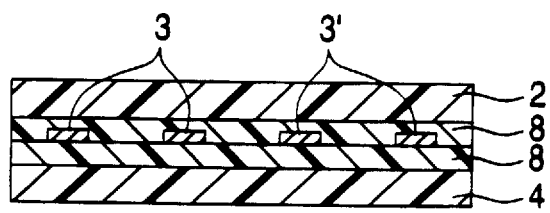
FIG. 16 is a sectional view to show an embodiment of a flexible printed circuit.
Figure 17A:
FIG. 17A is a sectional view of a base layer plastic film.
Figure 17B:
FIG. 17B is a sectional view to show a state in which an adhesive layer in formed on the base layer plastic film.
Figure 17C:
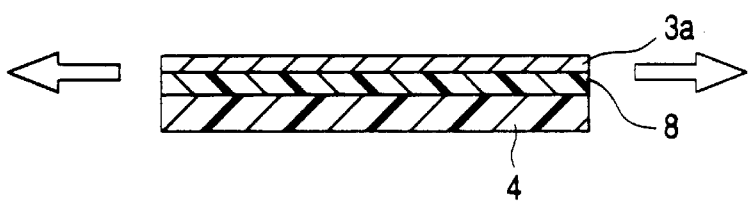
FIG. 17C is a sectional view to show a state in which a tension is imposed when a metal thin film is formed on the adhesive layer.
Figure 17D:
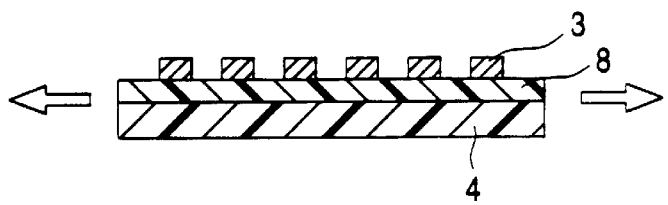
FIG. 17D is a sectional view to show a state in which a tension is imposed when the metal thin film is formed to metal electric circuit.
Figure 17E:
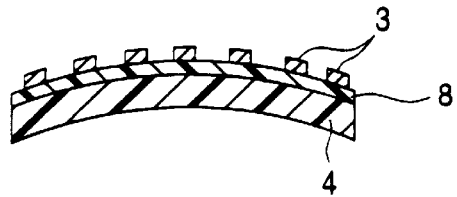
FIG. 17E is a sectional view to show a state in which a curl occurs in a laminate of the plastic film and metal electric circuit.

A flexible printed circuit of the invention comprises two plastic films 2 and 4 laminated on each other as shown in FIG. 16. The plastic film 2 is a plastic film for a cover layer and the plastic film 4 is a plastic film for a base layer.

For example, a polyimide film, a polyether nitrile film, a polyether sulfone film, a polyethylene terephthalate film, a polyvinyl chloride film and polyethylene naphthalate film can be listed as the plastic film types, among which the polyethylene terephthalate film, polyethylene naphthalate film and polyimide film are preferred totally considering heat resistance, dimension stability, electric characteristics, mechanical strength characteristics, chemical resistance, costs, etc. The plastic film normally is 0.01 to 0.3 mm thick and preferably 0.025 to 0.125 mm thick. Hereupon, it is preferable that the thickness of the two plastic films disposed on the two outermost layers are same with each other to prevent the curl occurence.

It is appropriate to stretch the bidirectionally stretched plastic film generally 1.5 to 15 times and preferably 2 to 9 times in a machine direction and 3 to 8 times in a transverse direction.

As described above, the two plastic films 2 and 4 need to satisfy at least one of the following three conditions that the two plastic films 2 and 4 are cut out from a raw material plastic film stretched in two directions by a specific aforementioned manner, that when ellipses of coefficient of linear expansion are overlapped, the maximum value of the linear expansion coefficient difference (Δα) should be equal to or less than $1.4 \times 10^{-10}$ (1/°C.), that the total area of the portions other than the overlap (C) should be equal to or less than $6.5 \times 10^{-10}$ [(1/°C.)×(1/°C.)].

The measurement method of the coefficient of linear expansion is a direct measurement method by TMA, and a ultrasonic propagation velocity measurement method developed by the inventors of the present invention may be adopted. That is, the tensile modulus and ultrasonic propagation velocity of the plastic film are closely related each other and the tensile modulus may be an index of the coefficient of linear expansion. Therefore, it may be possible to measure the coefficient of linear expansion of the predetermined part of the plastic film according to the measurement of the ultrasonic propagation velocity by means of SST (Sonic Sheet Tester; Nomura Shoji Corporation). Particularly, the method using the ultrasonic propagation velocities takes an extremely short measurement time of about two minutes as compared with the TMA method, is substantially at the same level of measurement accuracy as the TMA method, and has the advantage of no skill required. The measurement temperature in SST measurement is about preferably 23° C.±2° C.

Figure 2A:
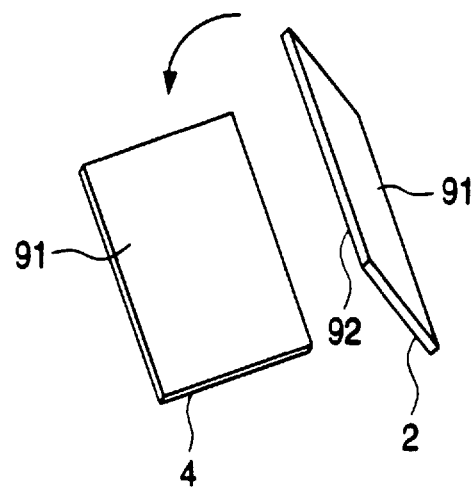
FIGS. 2A and 2B are a perspective view and a sectional view to show how to overlap two plastic films in the Embodiment of the invention.
Figure 2B:
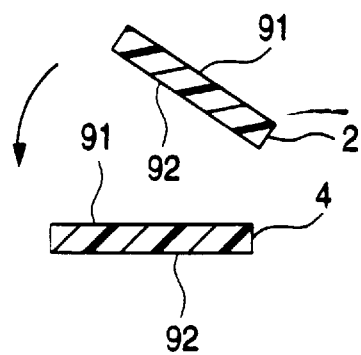
Figure 3:
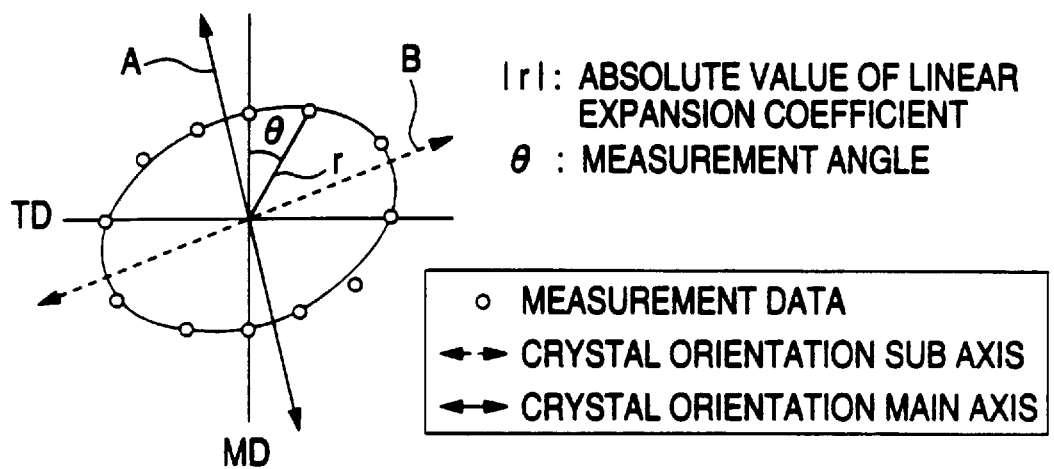
FIG. 3 is a polar coordinate plotting chart representing a linear expansion coefficient ellipse of a bidirectionally stretched plastic film.
Figure 4:
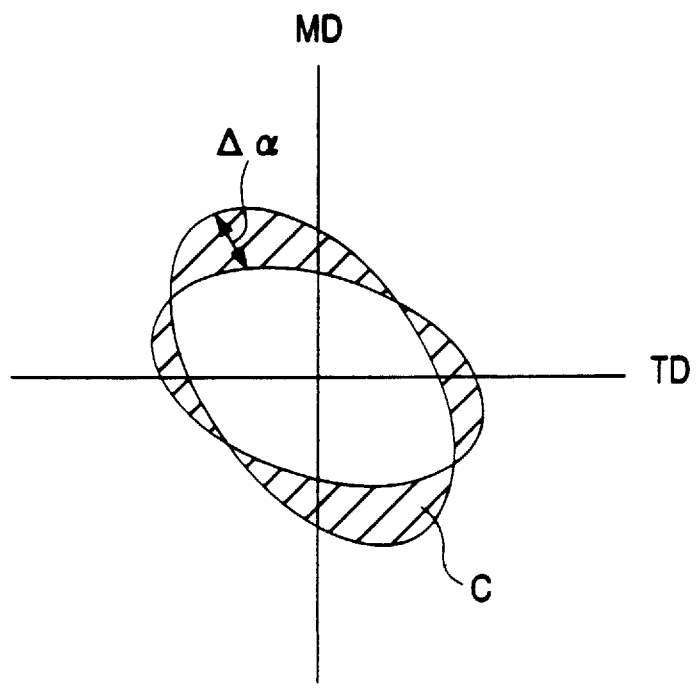
FIG. 4 is a polar coordinate plotting chart of overlapping two linear expansion coefficient ellipses.
Figure 5:
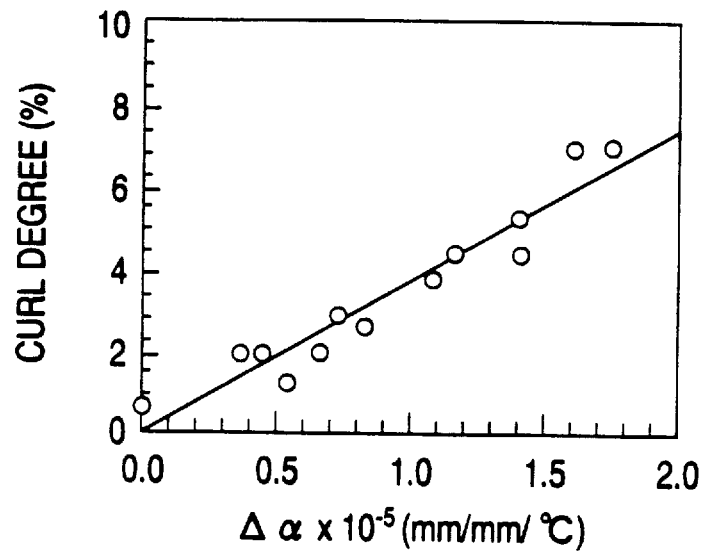
FIG. 5 is a graph to show the relationship between the maximum value of linear expansion coefficient difference and curl degree.
Figure 6:
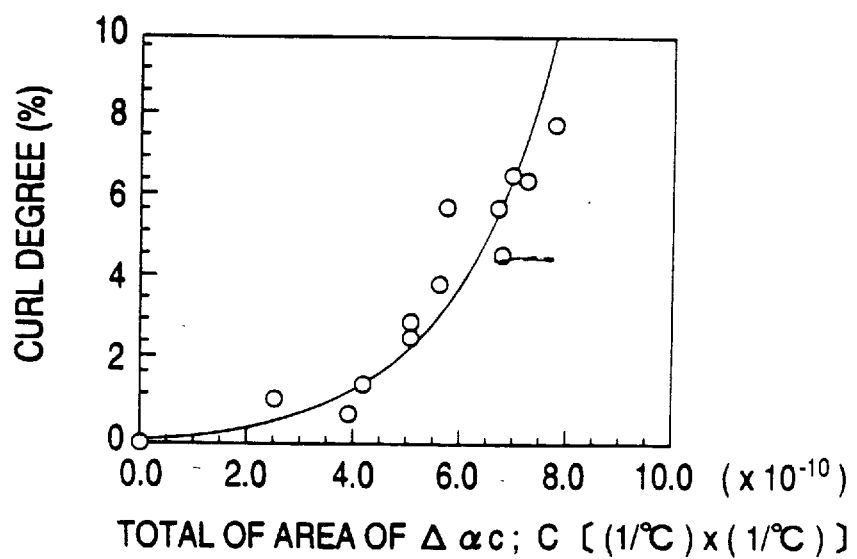
FIG. 6 is a graph to show the relationship between the total area of portions where linear expansion coefficient ellipses do not overlap and curl degree.
Figure 7:
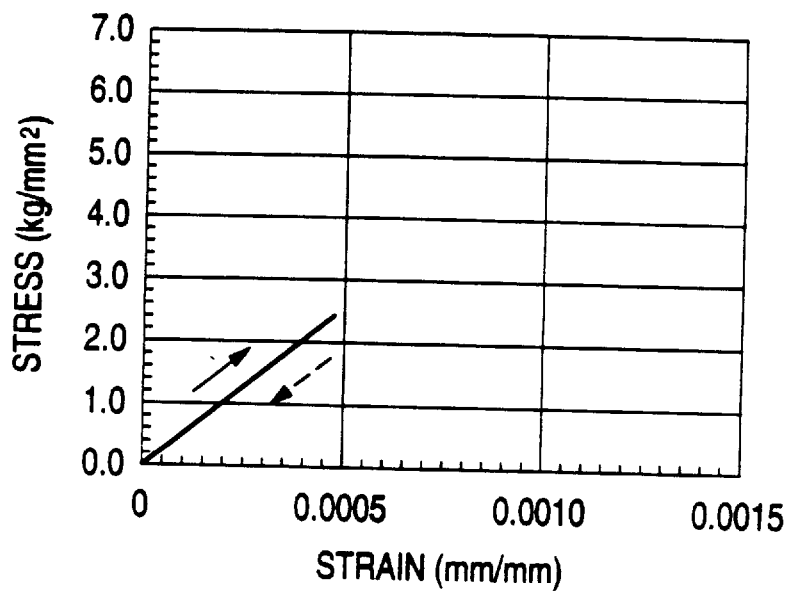
FIG. 7 is a graph to show S-S curves of material.
Figure 8:
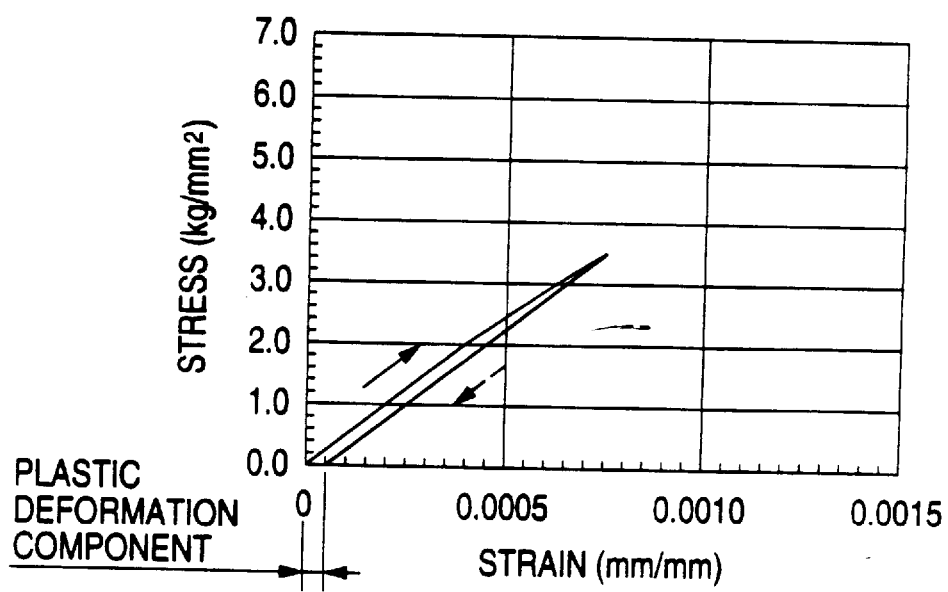
FIG. 8 is another graph to show S-S curves of material.
Figure 9:
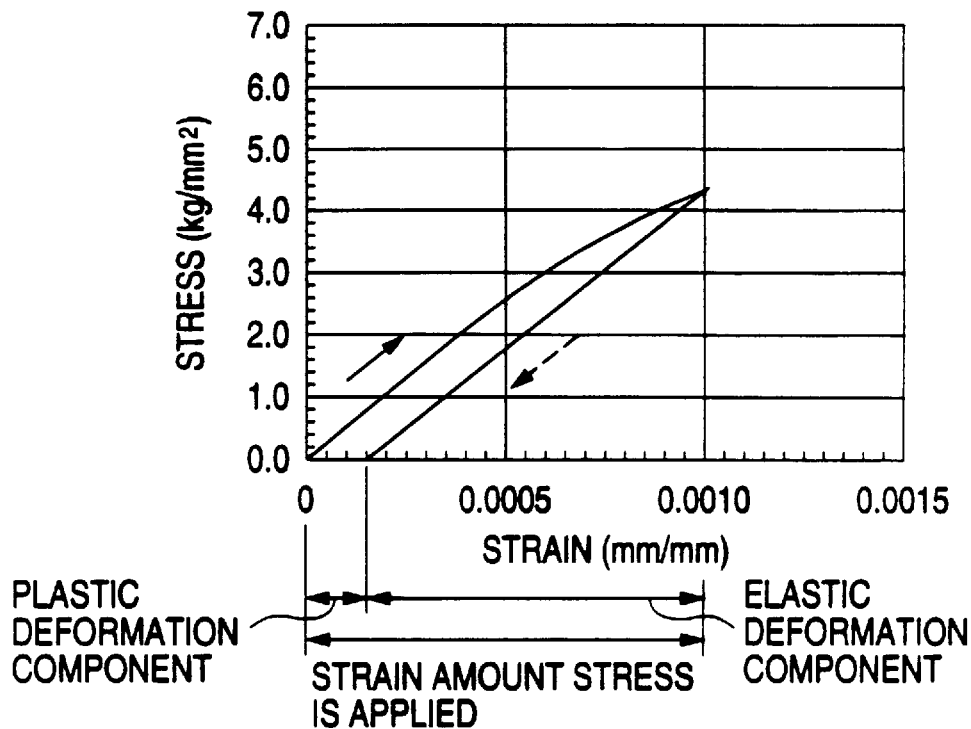
FIG. 9 is another graph to show S-S curves of material.
Figure 10:
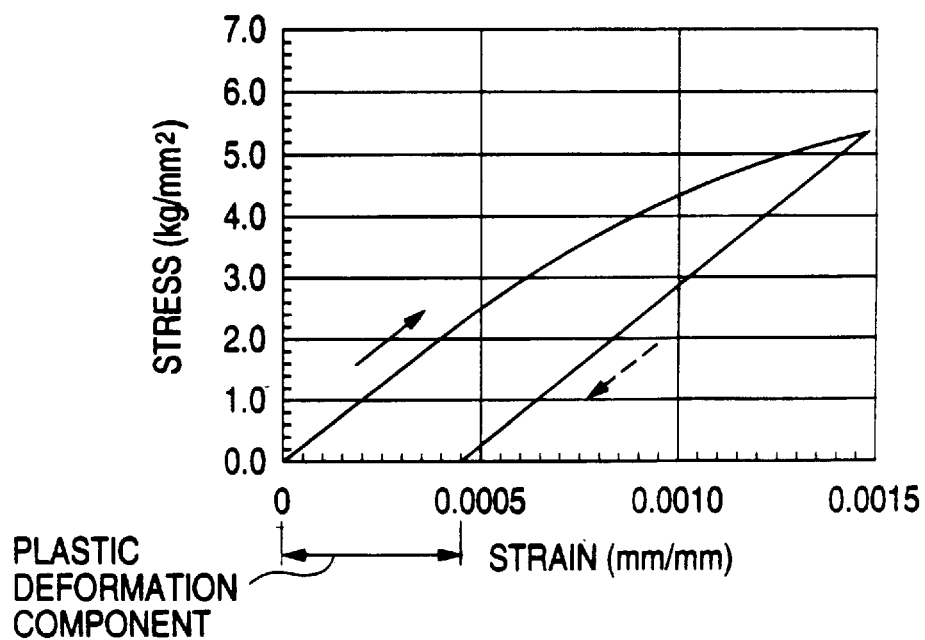
FIG. 10 is another graph to show S-S curves of material.

The above-mentioned linear expansion coefficient difference (Δα) can be derived as follows: First, a linear expansion coefficient ellipse for a plastic film is created by polar coordinate plotting according to the procedure described above (see FIG. 3). The radius of the ellipse, r, can be represented as a function of linear expansion coefficient measurement angle θ(rad), as in Expression (5) below. In Expression (5), ξ denotes an eccentricity and is defined by Expression (6) below. a is the long-axis radius of the ellipse and becomes the maximum value of r (rmax). On the other hand, b is the short-axis radius of the ellipse and becomes the minimum value of r (rmin).

$$r = r(\theta) = \sqrt{\frac{b^2}{1 - \xi^2 \cos^2\theta}} \quad (5)$$

$$\xi = \frac{\sqrt{a^2 - b^2}}{a} \quad (6)$$

where a: long-axis radius of ellipse (maximum value of r; rmax)

b: short-axis radius of ellipse (minimum value of r; rmin)

Assuming that the radiuses of ellipses for two plastic films 2 and 4 positioned on both outermost layers are r1 and r2, the linear expansion coefficient difference (Δα) can be represented by the following expression (7):

$$\Delta\alpha = \Delta\alpha(\theta) = |r_1(\theta) - r_2(\theta)| \quad (7)$$

According to Expression (7), comparison is made over 0 to 360 degrees (0 to 2 πrad) with respect to the measurement angle θ and the maximum value is the maximum value (Δαmax) of the linear expansion coefficient difference (Δα) between the two plastic films. The maximum value (Δαmax) can also be derived by using a computer programmed based on Expressions (5), (6), and (7).

On the other hand, the total area (C) of portions where the ellipses do not overlap can be derived, for example, according to cumulative expression (8), which is one of approximate expressions of Expression (3) for defining the area (C). Approximating of Expression (3) by other expressions is not limited.

$$C \approx 1/2 \sum_{n=1}^{m} \left[ \frac{\Delta\alpha c(n \times \Delta\theta) + \Delta\alpha c\{(n-1) \times \Delta\theta\}}{2} \right] \Delta\theta \quad (8)$$

where m=(2π/Δθ)

The metal electric circuit 3 is formed in the plastic film 4 used as a base layer. A metal such as copper, gold, stainless steel, or aluminum or an alloy comprising Be, Ni, Co, Ag, Pb, Cr, etc., added to the metal can be used as the above-mentioned metal. The metals or alloys also include those containing an inevitably mixed nonmetal element, such as C or O. Since a copper alloy (tough pitch copper comprising >99.9% Cu, 0.0002 to 0.06% $O_2$, Ag, etc.,) is excellent in mechanical characteristics of the strength, tensile modulus, etc., electrical characteristics of electric conductivity, etc., costs, etc., it preferably is used and generally in used.

In the invention, when a stress load is imposed until strain becomes 0.002 (mm/mm), the metal electric circuit 3 needs to have a plastic deformation component of 0.0003 (mm/mm) or more, as described earlier. The metal electric circuit having such a physical property can be formed by appropriately selecting the type of metal or alloy. When a stress load is imposed until strain becomes 0.002 (mm/mm), the normal range of the plastic deformation component is 0.0003 to 0.0015 and more preferably 0.0004 to 0.0010.

Here, the plastic deformation component and flexibility of metal electric circuit will be discussed by taking metal foil as an embodiment.

Figure 11:
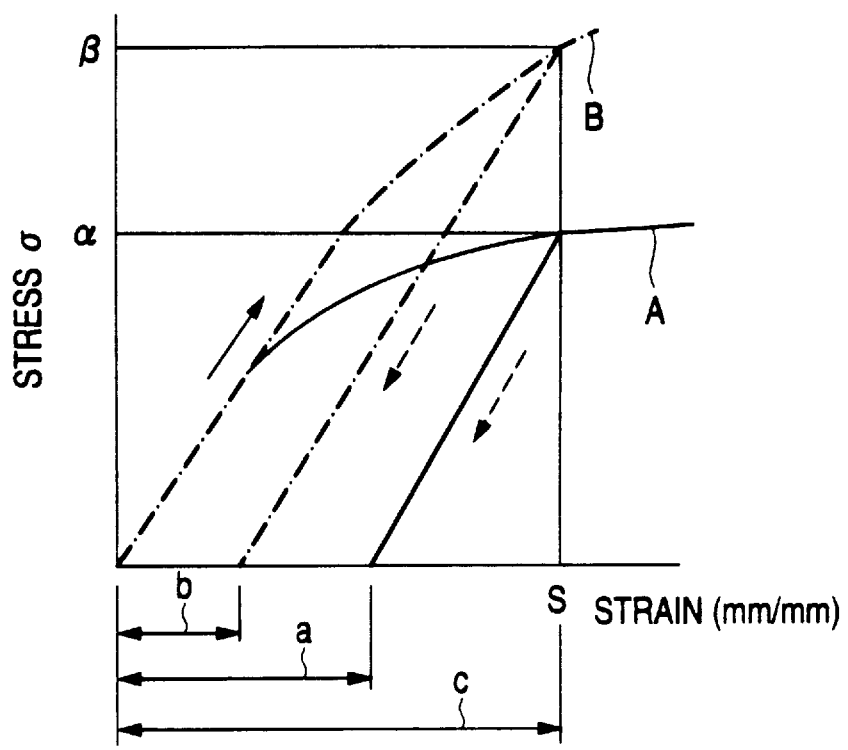
FIG. 11 is a graph to show S-S curves of two metal foil pieces.

FIG. 11 shows S-S curves of metal foil A and metal foil B, which differ in plastic deformation component. In the figure, a is the plastic deformation component (plastic strain amount) of the metal foil A when a stress load is imposed and then removed, b is the plastic deformation component (plastic strain amount) of the metal foil B when a stress load is imposed and then removed, and c is the strain amount (deformation amount) when a stress load in imposed on the metal foil A, B. In the figure, the direction in which the strain load is imposed (go way) is indicated by the solid line arrow and the direction in which the strain load is removed (return way) is indicated by the dotted line arrow. As shown in the figure, when the metal foil A and metal foil B are compared in the same strain amount (deformation amount), it is seen that the smaller the plastic deformation amount, the smaller the stress generated from the metal foil. The stress generated from the metal foil occurs as a reaction to the stress load imposed on the metal foil for deformation; that it is small means that the corresponding metal foil is excellent in flexibility. In the figure, specifically, when the strain amount is S (mm/mm), the stress of the metal foil A is α and that of the metal foil B is β; the stress β is larger than the stress α(β>α). The plastic deformation component a of the metal foil A is larger than the plastic deformation component b of the metal foil B. Therefore, the metal foil A having the larger plastic deformation component is more excellent in flexibility than the metal foil B having the smaller plastic deformation component.

We have discussed the relationship between the plastic deformation component and flexibility by taking the metal foil as an embodiment. If the metal foil is stuck on a plastic film to form electric circuit, the above-mentioned relationship is true. For example, if a metal thin film rather than the metal foil is formed on a plastic film by an electric plating method, a sputtering method, or the like to form electric circuit, the above-mentioned relationship is also true.

Figure 19:
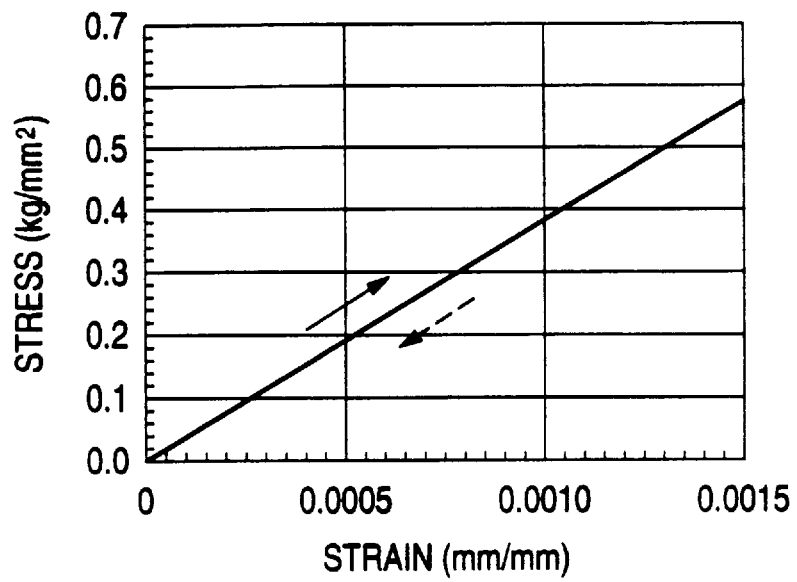
FIG. 19 is a graph to show S-S curves of a general plastic film.

For reference, S-S curves of a general plastic film are shown in a graph of FIG. 19, wherein the solid line arrow indicates the direction of a stress increasing path (go way) and the dotted line arrow indicates the direction of a stress decreasing (removing) path (return way). As shown in the figure, it is seen that the S-S curves of the plastic film are substantial lines and that when a stress load is imposed and then removed, the plastic film is restored substantially to the former length and has a plastic deformation component of substantial 0. This means that in contrast to the metal electric circuit, the plastic film has an extremely small plastic deformation component and its deformation becomes substantially elastically deformed.

Next, the flexible printed circuit is manufactured as shown in FIGS. 14A to 14D using the aforementioned material.

Figure 14A:
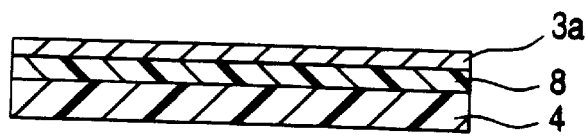
FIG. 14A is a sectional view to show a state in which an adhesive layer is formed on a base film and then copper foil is placed on the adhesive layer.
Figure 14B:
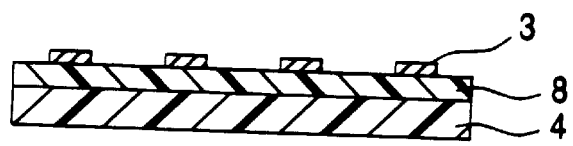
FIG. 14B is a sectional view to show a state in which the copper foil is formed to electric circuit.
Figure 14C:
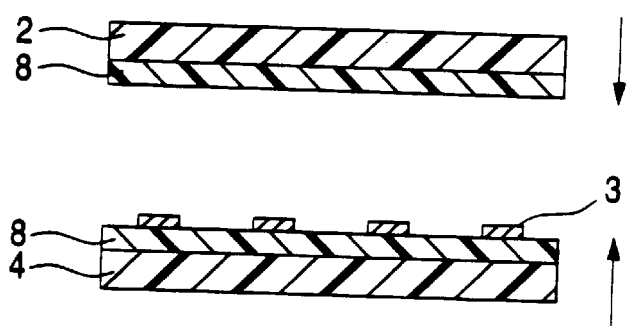
FIG. 14C is a sectional view to show a state of laminating plastic films for base and cover layers.

First, as shown in FIG. 14A, an adhesive layer 8 is formed on the surface of the plastic film 4 for the base layer, for example, by applying an adhesive onto the plastic film 4, then drying or by stacking an adhesive applied onto a separator on the plastic film 4, then removing the separator. Next, a metal thin film 3a is formed on the adhesive layer 8, for example, by placing metal foil such as copper foil on the adhesive layer B and roll laminate. The metal thin film 3a can also be formed by an electroplating method or a sputtering method, in which case it can be formed directly on the plastic film 4 without forming the adhesive layer 8. As shown in FIG. 14B, a known method such as a printing, subtractive, or additive method is used to treat the metal thin film 3a for forming metal electric circuit 3 in a predetermined circuit pattern. On the other hand, plastic film 2 for cover layer is prepared and an adhesive layer 8 is formed on the surface of the plastic film 2 in a similar manner to that described above. If the adhesive layer 8 is formed on the rear face of the plastic film 4 for the base layer, the adhesive layer 8 is formed on the rear face of the plastic film 2 for the cover layer. And as shown in FIG. 14C, both the plastic film 4 for the base layer and the plastic film 2 for the cover layer are stacked with their surfaces facing each other and laminated (laminated and bonded) in the stacked relation, for example, by a crimping method with a heat press or by a laminate method of applying at least heat or pressure after temporary crimping by rolling and laminating. The laminating method and conditions are determined appropriately by the types of plastic films, adhesives, etc.

Figure 15:
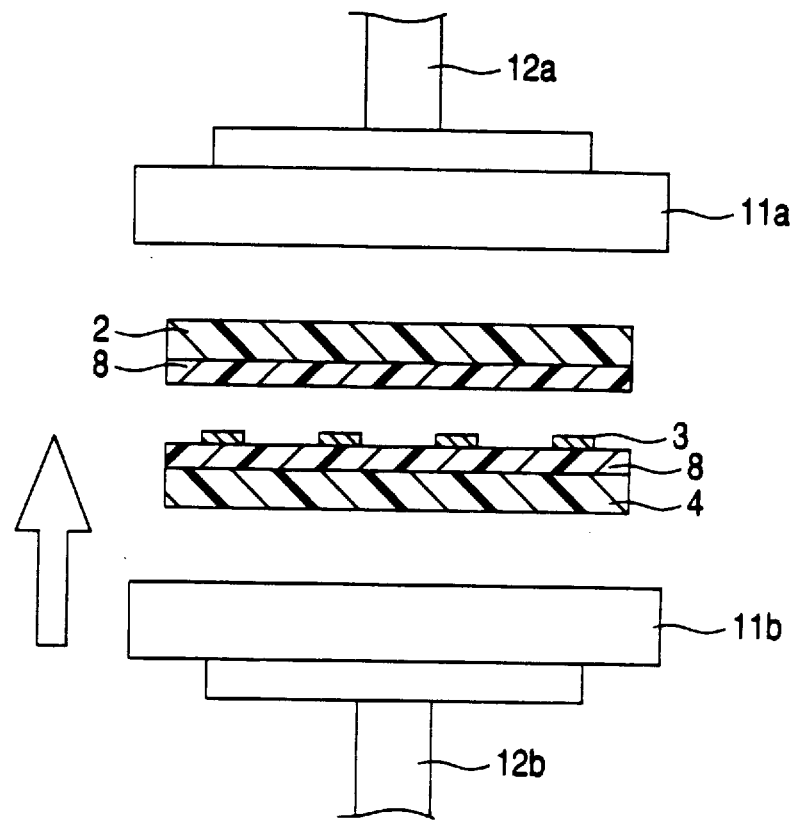
FIG. 15 is an illustration to show an embodiment of a heat press in the manufacturing method in FIGS. 14A to 14D.

FIG. 15 shows an embodiment of the crimping method by a heat press. In the figure, two heat plates 11a and 11b are placed at upper and lower positions in a state in which they face each other. The upper heat plate 11a is coupled with a support rod 12a and fixed. The lower heat plate 11b is coupled with a drive section (not shown) via a support rod 12b and can move up and down. Plastic films 2 and 4 are placed between the upper and lower heat plates 11a and 11b in a state in which an adhesive layer 8 and metal electric circuit 3 face each other. In this state, the drive section is operated for moving the lower heat plate 11b in the up direction indicated by the arrow, whereby the plastic films 2 and 4 are crimped and laminated with the metal electric circuit 3 between them.

Figure 14D:
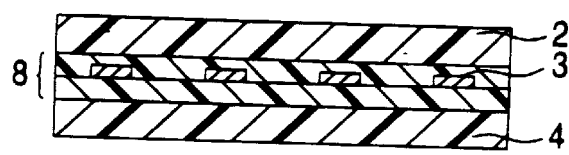
FIG. 14D is a sectional view to show the structure of a flexible printed circuit thus provided.

The flexible printed circuit as shown in FIGS. 14D or 16 can be thus manufactured. Incidentally, there arises a curling when the the metal electric circuit 3 is formed on the plastic film 4 for a base layer. However, in the present invention, the curling is suppressed by laminating the plastic film for a cover layer, so that the flexible printed circuit become plain. The pressure and temperature conditions common to the crimping method and the roll laminate method in the laminating normally are 40° C. to 300° C.×1 to 100 kg/cm² and preferably 50° C. to 200° C.×8 to 70 kg/cm².

In the invention as described above, the most basic method is to measure the coefficients of linear expansion for each plastic film and execute polar coordinate plotting for creating a linear expansion coefficient ellipse to check whether or not at least one of the condition of the maximum value of the linear expansion coefficient difference and the condition of the total area of portions where the ellipses do not overlap is satisfied; but it lacks practicality. Then, to solve this problem, the inventor et al. have developed the following method from knowledge obtained by examining the linear expansion coefficient characteristics of raw material plastic films:

In the raw material plastic film like a band, a region satisfying at least one of the two conditions related to the coefficients of linear expansion is previously examined and cover and base layer plastic films 2 and 4 are cut out from the region.

FIG. 18 shows an embodiment of linear expansion coefficient characteristics in the width direction of a bidirectionally stretched raw material plastic film 5 like a band. In the figure, the raw material plastic film 5 is divided into eight parts like band parallel with the machine direction (MD direction) thereof and the parts are represented by relative positions (−4, −3, −2, −1, 1, 2, 3, and 4) with a center line CL parallel with the machine direction (MD direction) as the reference. Linear expansion coefficient ellipses are shown in the parts and crystal orientation main axes are indicated by dotted line arrows. MD denotes the machine direction of stretch and TD denotes the transverse direction of stretch. As shown in FIG. 18, as the part of the raw material plastic film 5 deviates from the center line CL, its corresponding crystal orientation main axis shifts from the machine direction of stretch. In the figure, the parts near the center line CL of the raw material plastic film (−3, −2, −1, 1, 2, and 3) do not greatly differ in linear expansion coefficient difference and satisfy at least one of the two conditions as described above. Therefore, if the parts at relative positions (−3) to (−1) are used as cover layer cut parts and the parts at relative positions (1) to (3) are used as base layer cut parts and two plastic films cut out in the range are combined and placed on both the outermost layers with the surface of one plastic film facing the rear face of the other for manufacturing a flexible printed circuit, curl occurrence is suppressed. FIG. 18 shows a combination of a cover layer plastic film cut out from relative position (−3) and a base layer plastic film cut out from relative position (2).

Dividing of the raw material plastic film is shown as an embodiment; in fact, it is determined appropriately by the size, extension degree, etc., of the raw material plastic film. For example, for a raw material plastic film 2 to 6 m wide, if the division width (band width) is set to 200 to 1000 mm, the number of divisions becomes six to ten. Specifically, for example, if the raw material plastic film is 2 m wide, it can be divided into 10 parts (divisions) with the division width (band width) set to 200 mm. If the raw material plastic film is 6 m wide, it can be divided into six parts (divisions) with the division width (band width) set to 1000 mm. For example, if the raw material plastic film is 5 m wide, preferably it can be divided into 10 parts (divisions) with the division width (band width) set to 500 mm for the reason of good workability.

Therefore, the linear expansion coefficient ellipses of the parts of a raw material film are previously examined, the linear expansion coefficient characteristics are grasped and standardized, and the predetermined parts of the raw material film which satisfies at least one of the two conditions above are extracted. In doing so, the maximum value of the linear expansion coefficient difference and the total area of portions where the ellipses do not overlap can be set to predetermined values or less without creating linear expansion coefficient ellipses every time a plastic film is selected. As a result, the production efficiency of flexible printed circuits with curl occurrence suppressed can be improved.

We have discussed the manufacturing method of the flexible printed circuits of the invention by taking those with two plastic films laminated as embodiments. However, the invention is not limited to them and can also be applied to those with three or more plastic films laminated. As described above, in this case, only two plastic films positioned on both the outermost layers of plastic film laminates making up the flexible printed circuit need satisfy the predetermined conditions of the invention, and the plastic film positioned on an intermediate layer need not to be considered.

The thickness of the flexible printed circuit according to the invention is determined appropriately by applications, etc., of the flexible printed circuit, but generally set to 50 to 800 $\mu$m and preferably 100 to 600 $\mu$m. The shape of the flexible printed circuit is not limited; for example, the flexible printed circuit is formed as shapes responsive to various applications. The size of the flexible printed circuit is not limited either; for example, the flexible printed circuit may have the above-mentioned longest length L (see FIG. 12A) in the range of 10 to 1000 mm and preferably in the range of 30 to 600 mm.

Figure 13:
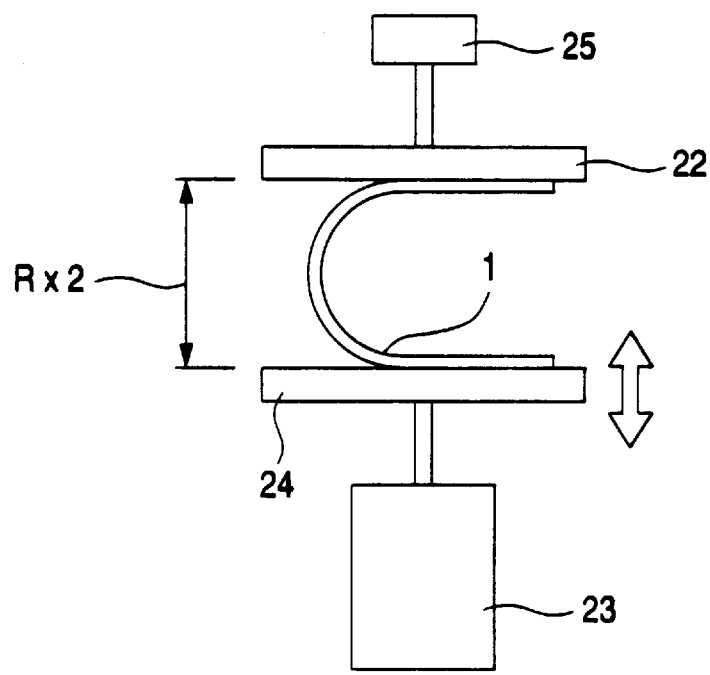
FIG. 13 is an illustration to show an embodiment of flexibility measurement of a flexible printed circuit.

Flexibility of the flexible printed circuits according to the invention is determined based on its shape or uses. For example, flexibility of the flexible printed circuits having rectangular shape (band shape) is measured with a compression tester as shown in FIG. 13. In the figure, 22 is an upper fixed plate above which a load cell (load detector) 25 is disposed, and a lower moving plate 24 that can move up and down in conjunction with a drive section (linear motor) 23 is disposed so as to face the lower side of the upper fixed plate 22. First, a flexible printed circuit 1 is placed between the upper fixed plate 22 and the lower moving plate 24 in a state in which it is bent like a U-shape in horizontal orientation in a long-side direction. Next, the drive section 23 is actuated for causing the lower moving plate 24 to rise for compressing the bent flexible printed circuit 1 sandwiched between the lower moving plate 24 and the upper fixed plate 22. When the bent flexible printed circuit 1 is compressed a given amount to a predetermined bend radius R, a repulsion force detected by the load cell 25 is measured and flexibility (repulsion force) is calculated from the expression (9) shown below for evaluation. Since the distance between the upper fixed plate 22 and the lower moving plate 24 at the measurement time becomes double the bend radius R of the flexible printed circuit 1, the bend radius R can be calculated from the distance.

Repulsion force (g/cm)= repulsion force detection value (g)/length of short side (width) of flexible printed circuit (cm) . . . (9)

The flexibility of the flexible printed circuit thus measured normally is in the range of repulsion force=2 g/cm when bend radius R=5 mm to repulsion force=600 g/cm when bend radius R=15 mm and preferably in the range of repulsion force=4 g/cm when bend radius R=5 mm to repulsion force=400 g/cm when bend radius R=15 mm.

Figure 12A:
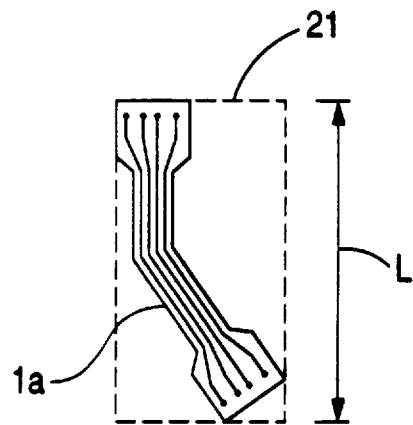
FIG. 12A is a schematic drawing to show the longest length of a flexible printed circuit and FIG. 12B is an illustration of curl amount measurement of a flexible printed circuit.
Figure 12B:
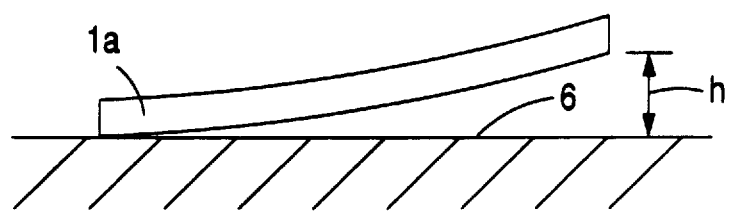

The flexibility evaluation method is applied to rectangular flexible printed circuits, but can also be applied to flexible printed circuits of any other shape than a rectangle. For example, for a flexible printed circuit shaped like substantially V-shaped as shown in FIG. 12A, a predetermined rectangle is previously cut out from the flexible printed circuit and the flexibility of this sample is evaluated by the above-described method, then cutting to the predetermined substantial shape may be performed. In this case, if the shape and size of samples for measurement are standardized, the flexibility can be evaluated objectively.

As we have discussed, for the flexible printed circuit of the invention, the physical properties of the metal electric circuit are specified for providing flexibility and durability and two plastic films placed on both the outermost layers of a plastic film laminate are specified and their placement is also specified, thereby matching both the outermost layers substantially in physical properties for balancing their deformation amounts. In doing so, even if the metal electric circuit and the plastic films differ in deformation nature, a curl of the flexible printed circuit is suppressed. Moreover, flexibility and durability of the metal electric circuit and the plastic films are not impaired, thus the flexible printed circuit of the invention becomes a high-performance flexible printed circuit comprising three features of flexibility, durability, and curl suppression. Therefore, for example, the flexible printed circuit becomes suitable for frequently bent places such as a connection part of a print head and a mother board of a printer. The flexible printed circuit of the invention is high in accuracy of the shape; if it is used to mount or install electronic parts, the electronic parts can be mounted with high accuracy even in automatic mounting by a machine.

Next, embodimets will be discussed together with comparisons.

Embodiment 1

Figure 20:
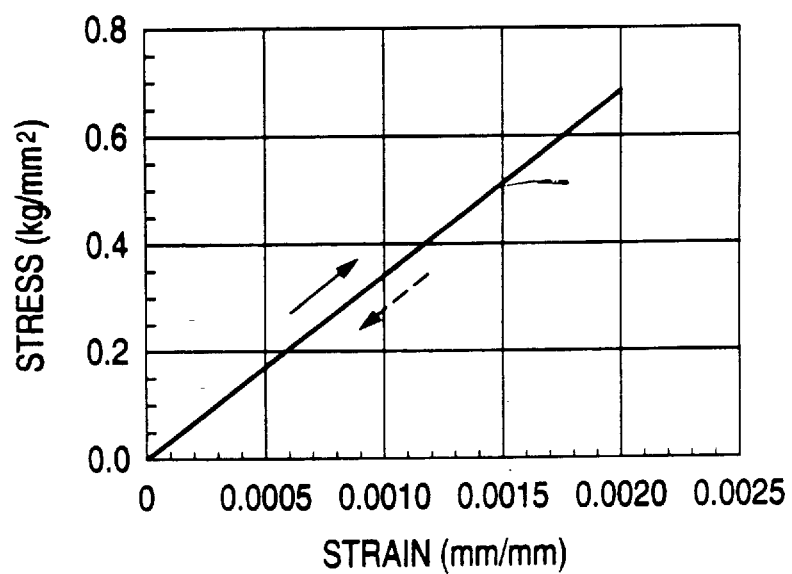
FIG. 20 is a graph to show S-S curves of a plastic film used with Embodiment of the invention.

A polyethylene terephthalate film 0.05 mm thick (manufactured by TORAY) like a band stretched in two directions of machine and transverse directions was used as a raw material plastic film. In the raw material plastic film, one standard line parallel with the machine direction of stretch was assumed and two rectangle areas due to cut in a state in which they had center points through which the standard line passed, and were aligned mutually in orientation were assumed to be on the standard line. Rectangular plastic films each having a size of 100×200 mm (film-A and film-B) were cut out from the two areas due to cut (see FIG. 1). S-S curve of film-A is shown in a graph of FIG. 20. The S-S curve is provided by imposing a stress load until strain amount 0.002 (mm/mm) for measurement conforming to ASTM D-882-83. As seen in the figure, film-A has little plastic deformation component and becomes substantially elastically deformed. For film-B, S-S curve was created in a similar manner and was the same as that for film-B.

For the two films of film-A and film-B, the maximum value of the linear expansion coefficient difference and the total area of portions where ellipses do not overlap with the surface of film-A facing the rear face of film-B were measured by a method described later. As a result, the maximum value of the linear expansion coefficient differ-ence was $0.2 \times 10^{-5}$ (1/°C.) and the total area of portions where the ellipses do not overlap was $2.1 \times 10^{-10}[(1/°C.) \times (1/°C.)]$.

Figure 21:
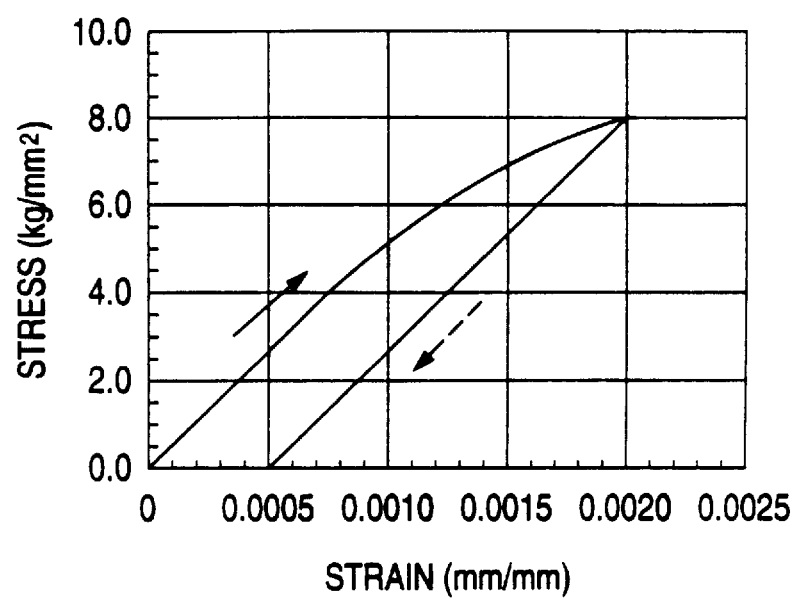
FIG. 21 is a graph to show S-S curves of copper foil used with an embodiment of the invention.

Next, a polyester system thermosetting adhesive was prepared and a flexible printed circuit was manufactured according to the above-described method (see FIG. 14). That is, first the adhesive was applied to the surface of film-A (for a base layer), then dried, forming an adhesive layer 0.03 mm thick. Next, copper foil (touch pitch copper 0.035 mm thick, BHY-02-T, manufactured by Nihon Kougyou) was placed on the adhesive layer. S-S curve of the copper foil is shown in a graph of FIG. 21. The S-S curve is provided by imposing a stress load until strain amount 0.002 (mm/mm) for measurement conforming to ASTM D-882-83. As seen in the figure, the copper foil has a plastic deformation component of 0.0005 (mm/mm), which is the predetermined value of the invention or more. The film-A and the copper foil were joined by a laminate roll whose surface was set to 120° C., and were pressurized and heated (conditions: 110° C.×2 h×10 kg/cm$^2$) and bonded. The copper foil was treated by a subtractive method to form electric circuit in a predetermined circuit pattern. A curl occurred when the electric circuit was formed. On the other hand, an adhesive layer 0.03 mm thick was formed on the rear face of film-B as for film-A. Both film-A and film-B were crimped under conditions 150° C.×1 h×30 kg/cm$^2$ and laminated by a heat press (see FIG. 15) with the surface of film-A facing the rear face of film-B.

For the flexible printed circuit thus provided, an attempt was made to measure the curl amount h by the above-mentioned method, but curl occurrence cannot be recognized and cannot be measured. That is, the curl occurring in the formation of the metal electric circuit was removed by forming the cover layer and the flexbile printed circuit became a flat shape. Flexibility and durability of the flexible printed circuit were also examined. The flexibility was measured by the above-mentioned method (FIG. 13). As a result, when bend radius R=5 mm, repulsion force was 26 g/cm. On the other hand, as evaluation of the durability, Cycles to Failure conforming to Flexural Fatigue and Ductility, Flexible Printed Wiring defined in IPC-FC-250A were found with mandrel diameter 0.125"(3.2 mm). As a result, Cycles to Failure were 820.

Comparison 1

Figure 22:
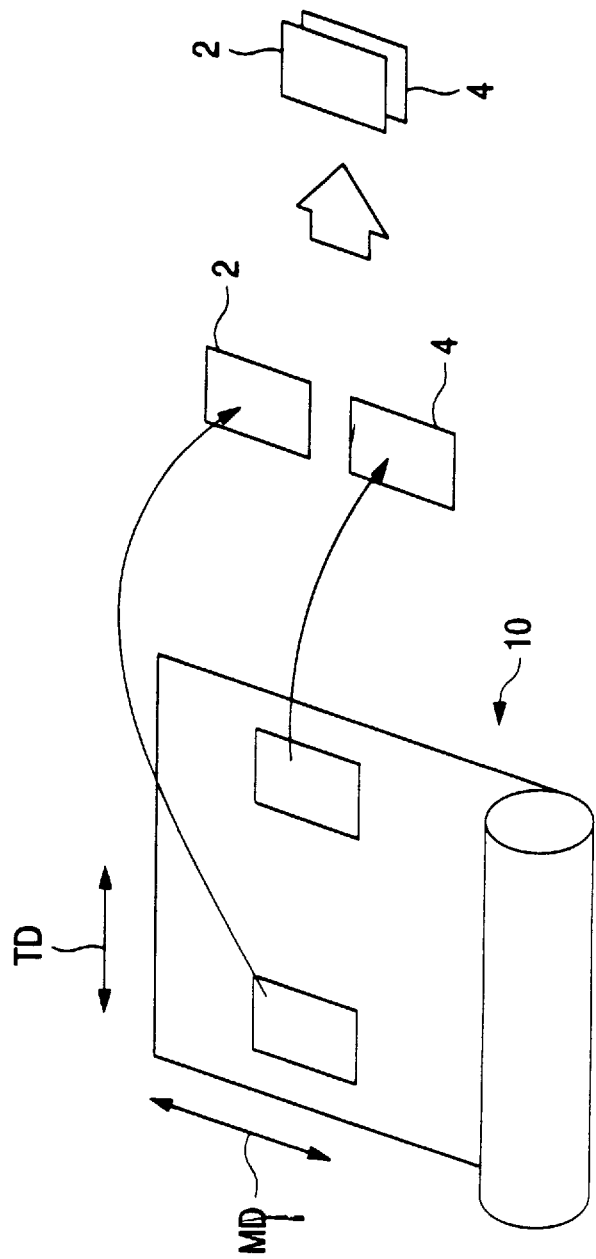
FIG. 22 is an illustration to show a state of cutting out plastic films from a raw material film in Comparison.

The same polyethylene terephthalate film 0.05 mm thick like a band as in Embodiment 1 was used as a raw material plastic film. As shown in FIG. 22, in the raw material plastic film, two rectangle areas due to cut arranged in the width direction of the raw material plastic film were assumed, from which rectangle plastic films each having a size of 100×200 mm (film-C and film-D) were cut out. For the two films of film-C and film-D, the maximum value of the linear expansion coefficient difference and the total area of portions where ellipses do not overlap with the surface of film-C facing the rear face of film-D were measured by a method described later. As a result, the maximum value of the linear expansion coefficient difference was 1.8×10$^{-6}$ (1/°C.) and the total area of portions where the ellipses do not overlap was 7.4×10$^{-10}$[(1/°C.)×(1/°C.)].

The film-C (for a base layer) and film-D (for a cover layer) were used to manufacture a flexible printed circuit as in Embodiment 1.

For this flexible printed circuit thus provided, curl occurrence, flexibility, and durability were examined as in Embodiment 1. As a result, for the flexibility, when bend radius R=5 mm, repulsion force was 27 g/cm, and for the durability, Cycles to Failure were 820; the values were substantially the same as those in Embodiment 1. However, for the curl occurrence, a curl occurring in the electric circuit formation remained still after the cover layer formation; the curl amount h was 19 mm and the curl degree was 9.5%.

Embodiment 2

A flexible printed circuit was manufactured in the same manner as in Embodiment 1 except that copper foil having a plastic deformation component of 0.0003 (mm/mm) when a stress load was imposed until strain amount 0.002 (mm/mm) was used.

For the flexible printed circuit, curl occurrence, flexibility, and durability were examined as in Embodiment 1. As a result, although an attempt was made to measure the curl amount h, as in Embodiment 1, curl occurrence cannot be recognized and cannot be measured. That is, the curl occurring in the formation of the metal electric circuit was removed by forming the cover layer and the flexible printed circuit became a flat shape. For the flexibility, when bend radius R=5 mm, repulsion force was 29.5 g/cm, which was a sufficient value. Cycles to Failure (durability) were 760, substantially the same degree as in Embodiment 1.

Embodiment 3

Figure 23:
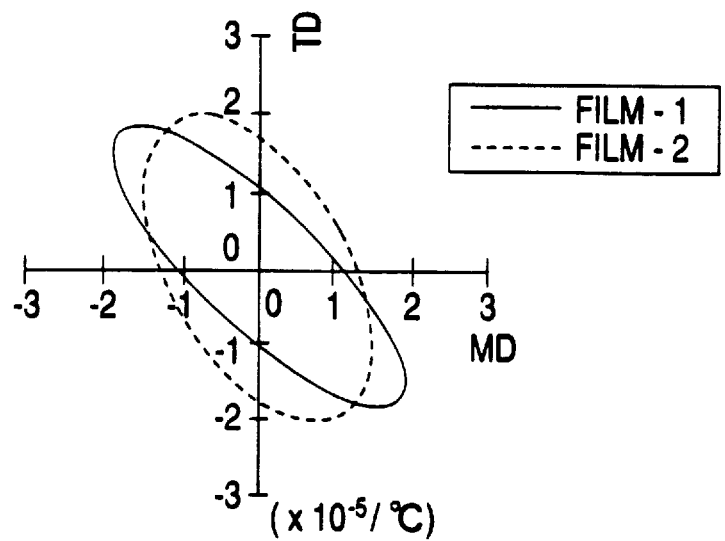
FIG. 23 is a polar coordinate plot chart of overlapping two linear expansion coefficient ellipses in Embodiments of the invention.

A polyethylene terephthalate film 0.05 mm thick (manufactured by TORAY) like a band stretched in two directions of machine and transverse directions was used as a raw material plastic film, from which plastic films (film-1 and film-2) each having a size of 100×200 mm were cut out. Coefficients of linear expansion film-1 and film-2 were measured by the above-described TMA method with the surface of film-1 facing the rear face of film-2 and linear expansion coefficient ellipses were created by polar coordinate plotting and were overlapped. These overlapped ellipses are shown in a graph of FIG. 23. From this graph, the maximum value of the linear expansion coefficient difference between film-1 and film 2 was calculated by using a control computer attached to TMA programmed based on Expressions (4), (5), and (6) described above. The result was 0.53×10$^{-5}$ (1/°C.), which was equal to or less than the predetermined value. The linear expansion coefficient measurement by TMA was executed to exclude the effect of hygroscopic expansion as follows: The plastic films were left standing for 60 minutes at 150° C. for drying, then while the plastic films were cooled from 150° C. to 30° C., the plastic film length and temperature were measured simultaneously and consecutively, and coefficients of linear expansion were found based on Expression (2) for regions of Tg or less.

Next, film-1 (for a base layer) and film-2 (for a cover layer) were used to manufacture a flexible printed circuit with the surface of film-1 facing the rear face of film-2 as in Embodiment 1. At this time, metal electric circuit was formed using the same adhesive and manufacturing method as in Embodiment 1 for the same copper foil as in Embodiment 1. For the flexible printed circuit, curl occurrence, flexibility, and durability were examined as in Embodiment 1. As a result, the curl amount h was 3.9 mm and the curl degree was 2.0%; curl occurrence was suppressed. For the flexibility, when bend radius R=5 mm, repulsion force was 27 g/cm, and for the durability, Cycles to Failure were 830; the values were substantially the same as those in Embodiment 1.

Comparison 2

Figure 24:
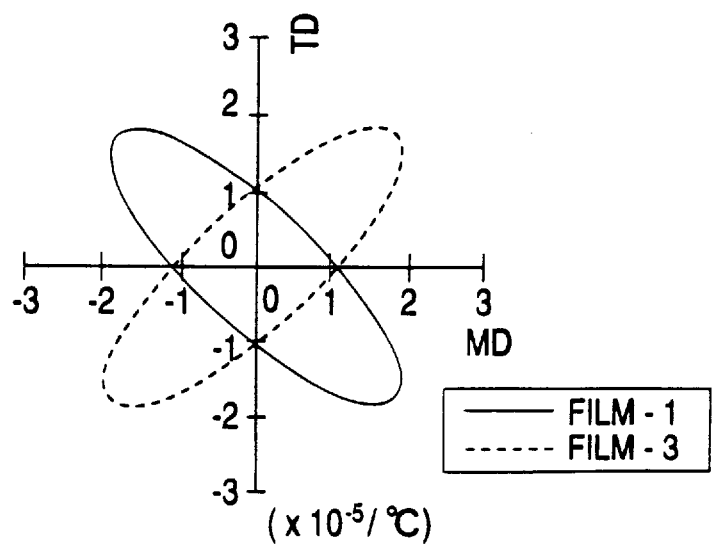
FIG. 24 is a polar coordinate plot chart of overlapping two linear expansion coefficient ellipses in Camparisons.

A new plastic film (film-3) having a size of 100×200 mm was cut out from the polyethylene terephthalate film used with Embodiment 3. On the other hand, the same film-1 as in Embodiment 3 was prepared. Linear expansion coefficient ellipses were created and overlapped as in Embodiment 1. These overlapped ellipses are shown in a graph of FIG. 24. From this graph, the maximum value of the linear expansion coefficient difference between film-1 and film-3 was calculated. The result was 1.77×10$^{-5}$ (1/°C.), which exceeded the predetermined value.

Film-1 and film-3 were used to manufacture a flexible printed circuit with the surface of film-1 facing the rear face of film-3 as in Embodiment 1. At this time, metal electric circuit was formed using the same adhesive and manufacturing method as in Embodiment 1 for the same copper foil as in Embodiment 1. For the flexible printed circuit, flexibility and durability were examined as in Embodiment 1. As a result, for the flexibility, when bend radius R=5 mm, repulsion force was 27.5 g/cm, and for the durability, Cycles to Failure were 800; the values were substantially the same as those in Embodiment 1. However, as a result of measuring the curl amount h of the flexible printed circuit as in Embodiment 1, the curl amount h was 13.5 mm and the curl degree was 6.8%; a curl occurred.

Embodiment 4

Figure 25:
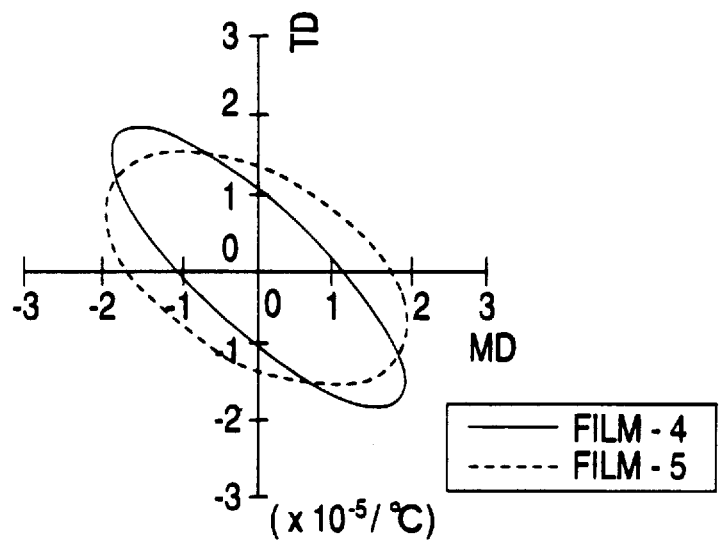
FIG. 25 is a polar coordinate plot chart of overlapping two linear expansion coefficient ellipses in Embodiments of the invention.

A polyimide film 0.125 mm thick (manufactured by TORAY Dupont) like a band stretched in two directions of machine and transverse directions was used as a raw material film, from which plastic films (film-4 and film-5) each having a size of 200×360 mm were cut out. Coefficients of linear expansion were measured by the above-described TMA method with the surface of film-4 facing the rear face of film-5 as in Embodiment 3 and linear expansion coefficient ellipses were created by polar coordinate plotting and were overlapped. These overlapped ellipses are shown in a graph of FIG. 25. From this graph, the total area of portions where the ellipses of film-4 and film-5 do not overlap (C) was $3.44\times10^{-10}[(1/°C.)\times(1/°C.)]$, which was equal to or less than the predetermined value. The area was calculated by using a control computer attached to a TMA measuring instrument programmed based on cumulative expression (8) described above by setting m=720 and $\Delta\theta=(2\pi/720) \approx 0.00873$ (rad).

Next, film-4 (for a base layer) and film-5 (for a cover layer) were used to manufacture a flexible printed circuit with the surface of film-4 facing the rear face of film-5 as in Embodiment 1. At this time, metal electric circuit was formed using the same adhesive and manufacturing method as in Embodiment 1 for the same copper foil as in Embodiment 1. The curl amount h of the flexible printed circuit was measured as in Embodiment 1. As a result, the curl amount h was 8.3 mm and the curl degree was 2.3%; curl occurrence was suppressed. As a result of examining the flexibility of the flexible printed circuit as in Embodiment 1, when bend radius R=5 mm, repulsion force was 160 g/cm. To evaluate the durability of the flexible printed circuit, Cycles to Failure conforming to Flexural Fatigue Test defined in IPC-FC-240C were found with curvature radius 5 mm. As a result, Cycles to Failure were $9\times10^6$.

Comparison 3

Figure 26:
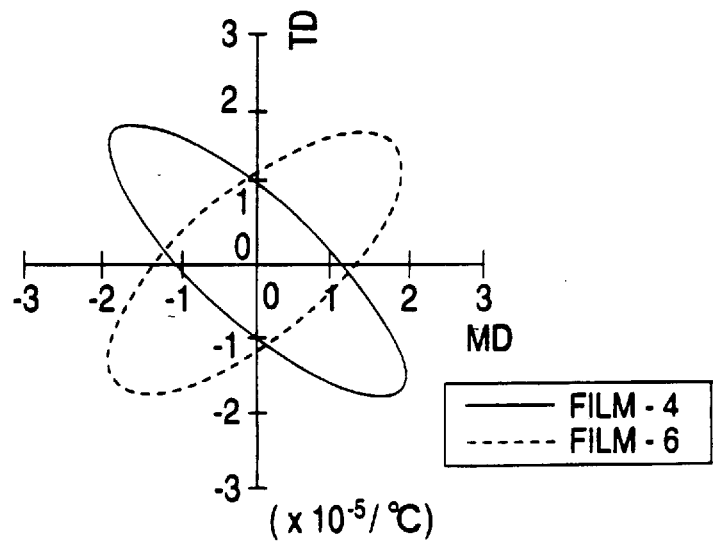
FIG. 26 is a polar coordinate plot chart of overlapping two linear expansion coefficient ellipses in Camparisons.

A new plastic film (film-6) having a size of 200×360 mm was cut out from the polyimide film used with Embodiment 4. On the other hand, the same film-4 as in Embodiment 4 was prepared. Linear expansion coefficient ellipses were created and overlapped with the surface of film-4 facing the rear face of film-6 as in Embodiment 4. These overlapped ellipses are shown in a graph of FIG. 26. Based on this graph, the total area of portions where the linear expansion coefficient ellipses of film-4 and film-6 do not overlap was calculated as in Embodiment 4. The result was $7.71\times10^{-5}[(1/°C.)\times(1/°C.)]$, which exceeded the predetermined value.

Next, Film-4 (for a base layer) and film-6 (for a cover layer) were used to manufacture a flexible printed circuit with the surface of film-4 facing the rear face of film-6 as in Embodiment 4. At this time, metal electric circuit was formed using the same adhesive and manufacturing method as in Embodiment 1 for the same copper foil as in Embodiment 1. The curl amount h of the flexible printed circuit was measured as in Embodiment 1. As a result, the curl amount h was 25.2 mm and the curl degree was 7.0%; a curl occurred. The flexibility and durability of the flexible printed circuit were examined as in Embodiment 4. As a result, for the flexibility, when bend radius R=5 mm, repulsion force was 166 g/cm. For the durability, Cycles to Failure were found with curvature radius 5 mm; as a result, Cycles to Failure were $8.3\times10^6$.

Embodiment 5

Figure 27:
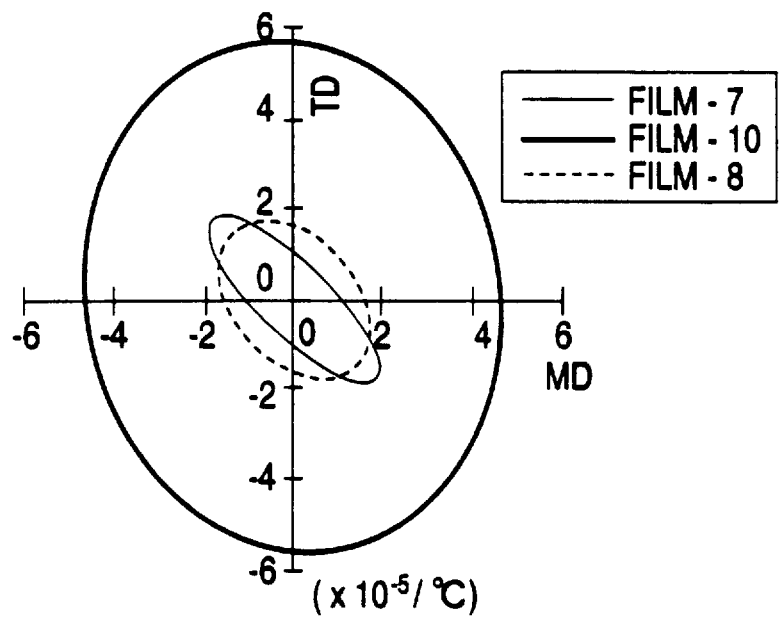
FIG. 27 is a polar coordinate plot chart of overlapping three linear expansion coefficient ellipses in Embodiments of the invention.

A polyethylene terephthalate film 0.125 mm thick stretched in two directions of machine and transverse directions (manufactured by TORAY) was used a raw material film, from which plastic films (film-7 and film-8) each having a size of 200×360 mm were cut out. A bidirectionally stretched polyethylene terephthalate film 0.250 mm thick (manufactured by TORAY) was used a raw material film, from which a plastic film (film-10) having a size of 200×360 mm was cut out. Three linear expansion coefficient ellipses were created and overlapped with the surface of film-7 facing the rear face of film-8 as in Embodiment 3. These overlapped ellipses are shown in a graph of FIG. 27. From this graph, the maximum values of the linear expansion coefficient differences among film-7, film-8, and film-10 were calculated as in Embodiment 3. As a result, the maximum value of the linear expansion coefficient difference between film-7 and film-8 was $0.54\times10^{-5}$ (1/°C.); that between film-7 and film-10 was $4.49\times10^{-5}$ (1/°C.); and that between film-8 and film-10 was $3.94\times10^{-5}$ (1/°C.).

Figure 29:
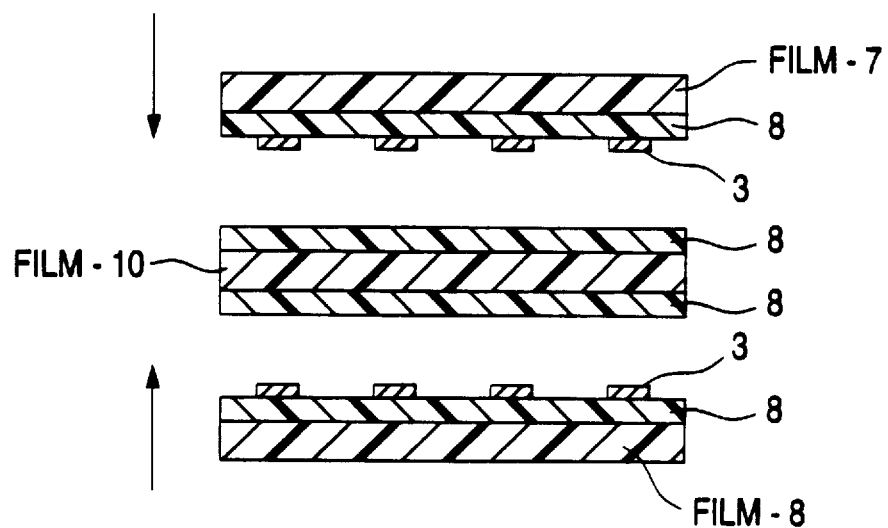
FIG. 29 is a sectional view to show a state of manufacturing a flexible printed circuit with three plastic film layers laminated.
Figure 30:
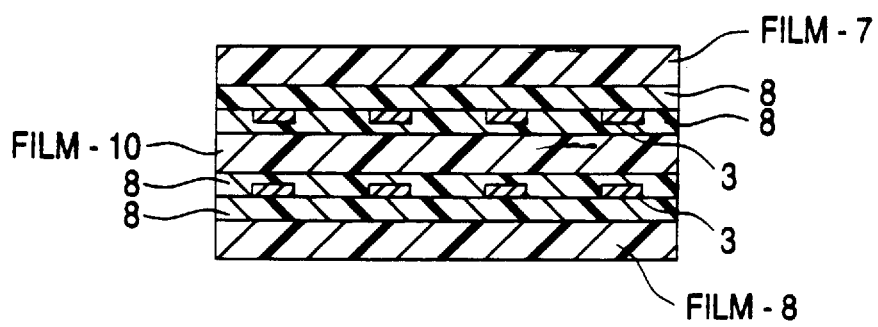
FIG. 30 is a sectional view to show the structure of a flexible printed circuit with three plastic film layers laminated.

Next, film-7, film-8, and film-10 were used to manufacture a flexible printed circuit. That is, first, as shown in FIG. 29, a polyester family thermosetting adhesive shaped like a sheet 0.05 mm thick was prepared and temporarily crimped on the surface of film-7 and the rear face of film-8 with a roll to form adhesive layers 8. Copper electric circuit 3 0.035 mm thick was formed on each of the adhesive layers by the subtractive method as in Embodiment 1. Also, a polyester family thermosetting adhesive like a sheet was used to form an adhesive layer 8 on the surface and rear face of film-10, an described above. As shown in FIG. 29, film-7, film-8, and film-10 were temporarily crimped by the roll laminate method with the surface of film-7 facing the rear face of film-8 with film-10 between, then cured in an autoclave (conditions: 110° C.×2 h×10 kg/cm²) for manufacturing a flexible printed circuit of a 3-film-layer structure as shown in FIG. 30. Parts identical with those previously described with reference to FIG. 29 are denoted by the same reference numerals in FIG. 30. Positioned on both the outermost layers of the plastic film laminate in the flexible printed circuit are film-7 and film-8. As described above, the maximum value of the linear expansion coefficient difference between film-7 and film-8 is $0.54\times10^{-5}$ (1/°C.), which is equal to or less than the predetermined value of the invention.

For the flexible printed circuit of the 3-film-layer structure, the curl amount h was measured as in Embodiment 1. As a result, the curl amount h was 5.0 mm and the curl degree was 1.4%; curl occurrence was suppressed. As a result of examining the flexibility of the flexible printed circuit as in Embodiment 1, when bend radius R=15 mm, repulsion force was 360 g/cm.

Comparison 4

Figure 28:
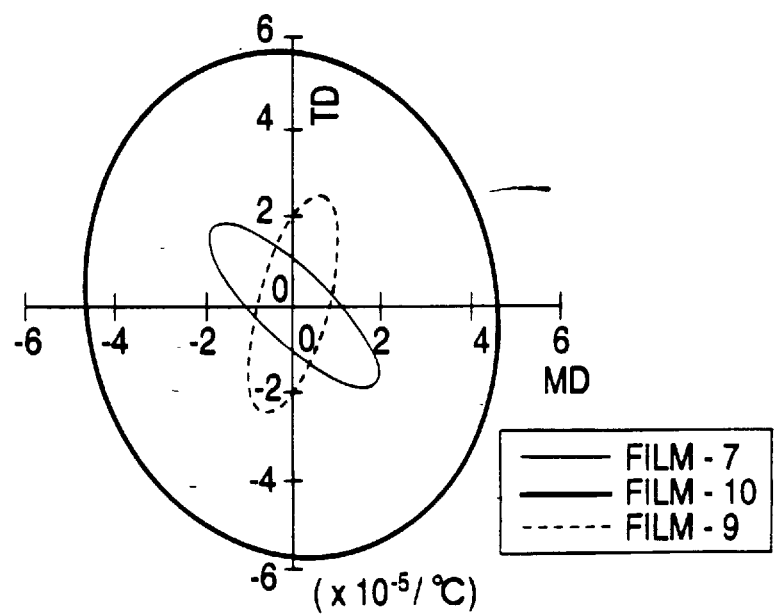
FIG. 28 is a polar coordinate plot chart of overlapping three linear expansion coefficient ellipses in Camparisons.

A new plastic film (film-9) having a size of 200×360 mm was cut out from the polyethylene terephthalate film 0.125 mm thick used with Embodiment 5. On the other hand, the same film-7 and film-10 as in Embodiment 5 were prepared. Three linear expansion coefficient ellipses were created and overlapped as in Embodiment 5. These overlapped ellipses are shown in a graph of FIG. 28. From this graph, the maximum values of the linear expansion coefficient differences among film-7, film-9, and film-10 were calculated as in Embodiment 1. As a result, the maximum value of the linear expansion coefficient difference between film-7 and film-9 was 1.66×10⁻⁵ (1/°C.) and that between film-9 and film-10 was 4.17×10⁻⁵ (1/°C.). As described earlier, the maximum value of the linear expansion coefficient difference between film-7 and film-10 is 4.49×10⁻⁵ (1/°C.).

Next, film-7, film-9, and film-10 were used to manufacture a flexible printed circuit in the same manner to that in Embodiment 5 except that film-9 was used in place of film-8. For the flexible printed circuit, the curl amount h was measured as in Embodiment 1. As a result, the curl amount h was 18.9 mm and the curl degree was 5.3%; a curl occurred. As a result of examining the flexibility of the flexible printed circuit as in Embodiment 1, when bend radius R=15 mm, repulsion force was 370 g/cm.

Embodiment 6

A raw material plastic film made of polyethylene terephthalate 0.05 mm thick and 4 m wide stretched in two directions of machine and transverse directions was prepared. It was divided into eight parts like bands (each 500 mm wide) parallel with the length direction (machine direction of stretch) of the plastic film, as shown in FIG. 18. In the raw material plastic film, the coefficients of linear expansion of the parts (divisions) were measured as in Embodiment 3, and combinations of the relative positions were considered. The condition that the maximum value of the linear expansion coefficient difference is 1.4×10⁻⁵ (1/°C.) or less was satisfied in the range of relative positions (−3) to (3). As shown in FIG. 18, a cover layer plastic film (film 11) having a size of 80×200 mm was cut out from the relative position (−3) and a base layer plastic film (film 12) having a size of 80×200 mm was cut out from the relative position (2). For film-11 and film 12, the linear expansion coefficient differences were measured with the rear face of film-11 facing the surface of film-12. The maximum value of the linear expansion coefficient difference was 1.1×10⁻⁵ (1/°C.).

As in Embodiment 3, film-11 and film-12 were used to manufacture a flexible printed circuit with the rear face of film-11 facing the surface of film-12. The curl amount h of the flexible printed circuit was measured as in Embodiment 1. As a result, the curl amount h was 7.6 mm and the curl degree was 3.8%; curl occurrence was suppressed. The flexibility and durability of the flexible printed circuit were examined as in Embodiment 1. As a result, for the flexibility, when bend radius R=5 mm, repulsion force was 27 g/cm. For the durability, Cycles to Failure were 810, substantially the same degree as in Embodiment 1.

It is to be understood that the foregoing description and the accompanying drawings are not intended to limit the scope of this invention; rather, various modifications or variations may be made by those of ordinary skill in the art without departing from the scope of this invention which is defined by the appended claims. For example, the present invention also can be applied to an ordinary composite sheet not only to the flexible printed circuit. The composite sheet according to the present invention may be also applied to IC card, credit card or the like.

What is claimed is:

1. A composite sheet comprising:
    a first resin film;
    a second resin film laminated on the first resin film so that a surface of the first resin film faces a rear face of the second resin film; and
    a metal electric circuit formed between the first and second resin films, the metal electric circuit having a plastic deformation component, which is measured after a stress load is imposed to a strain of 0.002 (mm/mm) and removed from the metal electric circuit, of at least 0.0003 (mm/mm);
    wherein the first and second resin films have substantially the same shape as one another and are cut out from two areas of a plastic film sheet which is stretched in both a machine direction and a transverse direction, and the two areas are mutually aligned in orientation such that an arbitrary point of one of the two areas and a point on the other area corresponding to the arbitrary point are located on the plastic film sheet on an arbitrary standard line which is parallel with the machine direction of stretch.

2. The composite sheet according to claim 1, wherein the composite sheet is a flexible printed circuit.

3. The composite sheet according to claim 1, wherein one or more other resin films are sandwiched between the first and second resin films.

4. The composite sheet according to claim 1, wherein each of the first and second resin films are laminated to the composite sheet via a corresponding adhesive layer.

5. The composite sheet according to claim 1, wherein the plastic deformation component of the metal electric circuit is between 0.0003 and 0.0015 (mm/mm).

6. The composite sheet according to claim 1, wherein the plastic deformation component of the metal electric circuit is between 0.0004 and 0.0010 (mm/mm).

7. A composite sheet comprising:
    a first resin film having a first linear expansion coefficient ellipse defined by a pair of first polar coordinate axes and a first base point located at an intersection of the first axes;
    a second resin film laminated on the first resin film so that a surface of the first resin film faces a rear face of the second resin film, said second resin film having a second linear expansion coefficient ellipse defined by a second pair of polar coordinate axes and a second base point located at an intersection of the second axes; and
    a metal electric circuit formed between the first and second resin films, the metal electric circuit having a plastic deformation component, which is measured after a stress load is imposed to a strain of 0.002 (mm/mm) and removed from the metal electric circuit, of at least 0.0003 (mm/mm);
    the second resin film being laminated on the first resin film such that the second ellipse overlaps the first ellipse with the first axes coinciding with the second axes and the first base point coinciding with the second base point;
    wherein the first and second linear expansion coefficient ellipses are a set of distances from the first and second base points, respectively, representing magnitudes of linear expansion coefficients of the first and second resin films, respectively, in directions having a measurement angle θ with respect to one of the first axes and the corresponding one of the second axes, respectively; and
    wherein a maximum difference between a linear expansion coefficient having the measurement angle θ of the first resin film and a linear expansion coefficient having the measurement angle θ of the second resin film is equal to or less than 1.4×10⁻⁵ (1/°C.).

8. The composite sheet according to claim 7, wherein the composite sheet is a flexible printed circuit.

9. The composite sheet according to claim 7, wherein one or more other resin films are sandwiched between the first and second resin films.

10. The composite sheet according to claim 7, wherein each of the first and second resin films are laminated to the composite sheet via a corresponding adhesive layer.

11. The composite sheet according to claim 7, wherein the plastic deformation component of the metal electric circuit is between 0.0003 and 0.0015 (mm/mm).

12. The composite sheet according to claim 7, wherein the plastic deformation component of the metal electric circuit is between 0.0004 and 0.0010 (mm/mm).

13. The composite sheet according to claim 7, wherein the Y axis of each of the first and second axes is located in the machine direction and the X axis of each of the first and second axes is located in the transverse direction of film stretch.

14. A composite sheet comprising:
- a first resin film having a first linear expansion coefficient ellipse defined by a pair of first polar coordinate axes and a first base point located at an intersection of the first axes; and
- a second resin film laminated on the first resin film so that a surface of the first resin film faces a rear face of the second resin film, said second resin film having a second linear expansion coefficient ellipse defined by a second pair of polar coordinate axes and a second base point located at an intersection of the second axes; and
- a metal electric circuit formed between the first and second resin films, the metal electric circuit having a plastic deformation component, which is measured after a stress load is imposed to a strain of 0.002 (mm/mm) and removed from the metal electric circuit, of at least 0.0003 (mm/mm);
- the second resin film being laminated on the first resin film such that the second ellipse overlaps the first ellipse with the first axes coinciding with the second axes and the first base point coinciding with the second base point;

wherein the first and second linear expansion coefficient ellipses are a set of distances from the first and second base points, respectively, representing magnitudes of linear expansion coefficients of the first and second resin films, respectively, in directions having a measurement angle θ with respect to one of the first axes and the corresponding one of the second axes, respectively; and wherein a total area of portions where the first and second ellipses do not overlap is equal to or less than $6.5 \times 10^{-10}$ (1/°C.)×(1/°C.).

15. The composite sheet according to claim 14, wherein the composite sheet is a flexible printed circuit.

16. The composite sheet according to claim 14, wherein one or more other resin films are sandwiched between the first and second resin films.

17. The composite sheet according to claim 14, wherein each of the first and second resin films are laminated to the composite sheet via a corresponding adhesive layer.

18. The composite sheet according to claim 14, wherein the plastic deformation component of the metal electric circuit is between 0.0003 and 0.0015 (mm/mm).

19. The composite sheet according to claim 14, wherein the plastic deformation component of the metal electric circuit is between 0.0004 and 0.0010 (mm/mm).

20. The composite sheet according to claim 14, wherein the Y axis of each of the first and second axes is located in the machine direction and the X axis of each of the first and second axes is located in the transverse direction of film stretch.

* * * * *